(12) United States Patent
Miller

(10) Patent No.: US 7,583,101 B2
(45) Date of Patent: Sep. 1, 2009

(54) PROBING STRUCTURE WITH FINE PITCH PROBES

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/624,661

(22) Filed: Jan. 18, 2007

(65) Prior Publication Data

US 2008/0174328 A1    Jul. 24, 2008

(51) Int. Cl.
    *G01R 31/02* (2006.01)
(52) U.S. Cl. .............. 324/762; 324/754; 324/757; 324/758
(58) Field of Classification Search .......... 324/754–762
    See application file for complete search history.

(56) References Cited

U.S. PATENT DOCUMENTS

| | | | | |
|---|---|---|---|---|
| 4,961,052 A | * | 10/1990 | Tada et al. ................. | 324/754 |
| 5,221,895 A | | 6/1993 | Janko et al. | |
| 6,181,150 B1 | * | 1/2001 | Okuno ....................... | 324/762 |
| 6,184,053 B1 | | 2/2001 | Eldridge et al. | |
| 6,329,827 B1 | * | 12/2001 | Beaman et al. ............ | 324/754 |
| 6,621,282 B2 | | 9/2003 | Hollman | |
| 6,687,980 B1 | | 2/2004 | Link et al. | |
| 6,879,170 B2 | * | 4/2005 | Norman et al. ............ | 324/754 |
| 7,126,358 B2 | | 10/2006 | Mok et al. | |
| 2002/0151194 A1 | * | 10/2002 | Grube ........................ | 439/66 |
| 2004/0169521 A1 | * | 9/2004 | Rincon et al. .............. | 324/754 |
| 2005/0046433 A1 | * | 3/2005 | Treibergs et al. ........... | 324/763 |
| 2005/0225336 A1 | * | 10/2005 | Kojima ....................... | 324/754 |
| 2006/0103399 A1 | * | 5/2006 | Kuo .......................... | 324/754 |
| 2007/0296433 A1 | * | 12/2007 | Gritters ..................... | 324/757 |

OTHER PUBLICATIONS

PCT/US2008/51473: International Search Report and Written Opinion of the International Searching Authority.

* cited by examiner

*Primary Examiner*—Ha Tran T Nguyen
*Assistant Examiner*—Karen M Kusumakar
(74) *Attorney, Agent, or Firm*—N. Kenneth Burraston

(57) ABSTRACT

A microelectronic resilient structure can comprise a support member and a platform attached to the support member. The platform can comprise a non-conductive, resilient beam that extends away from the support member, and a plurality of conductive members can be disposed on the beams. The conductive members can extend along a length of the beam. A plurality of conductive contact elements can be disposed on the beam and electrically connected to one of the conductive members.

30 Claims, 20 Drawing Sheets

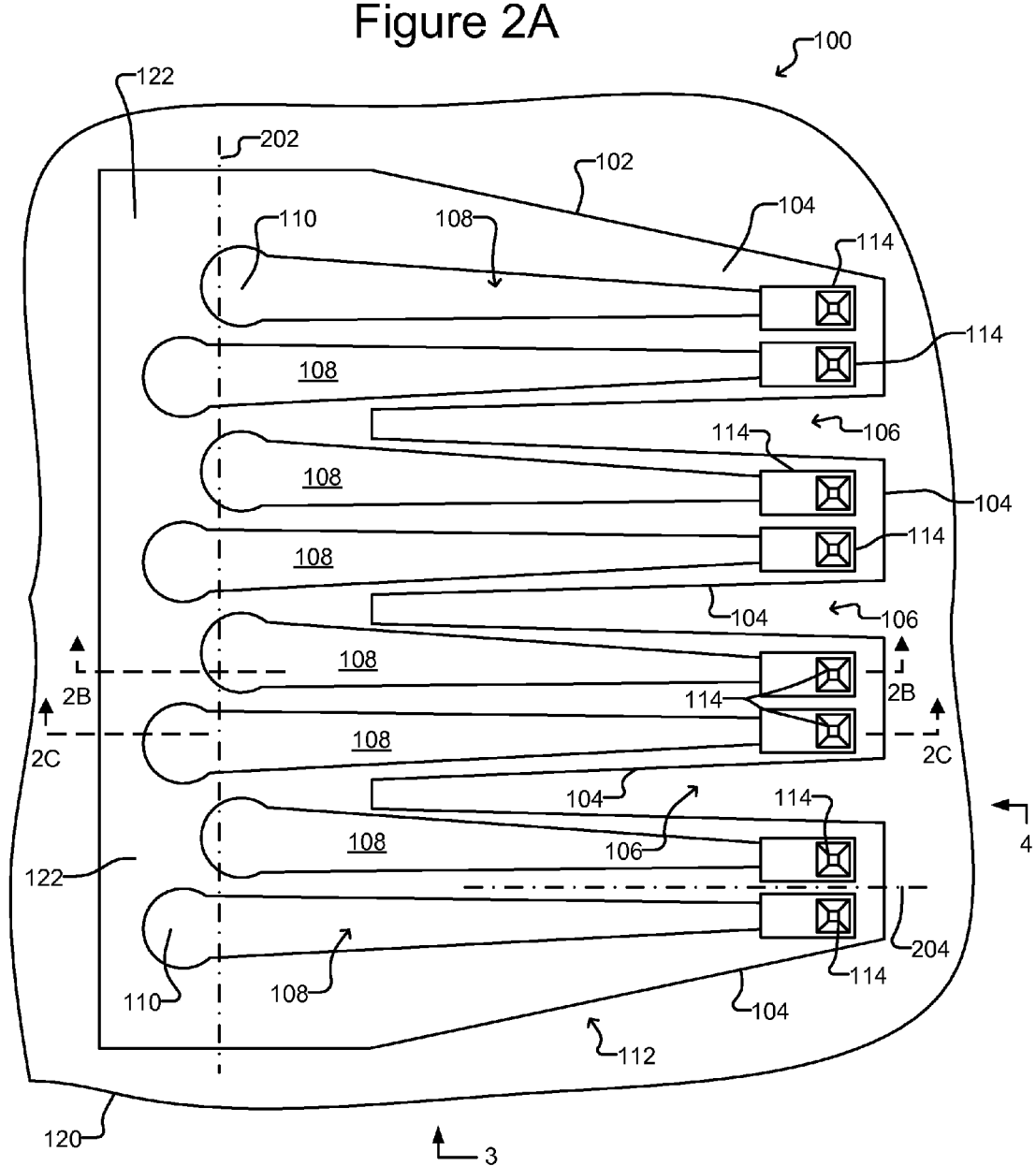

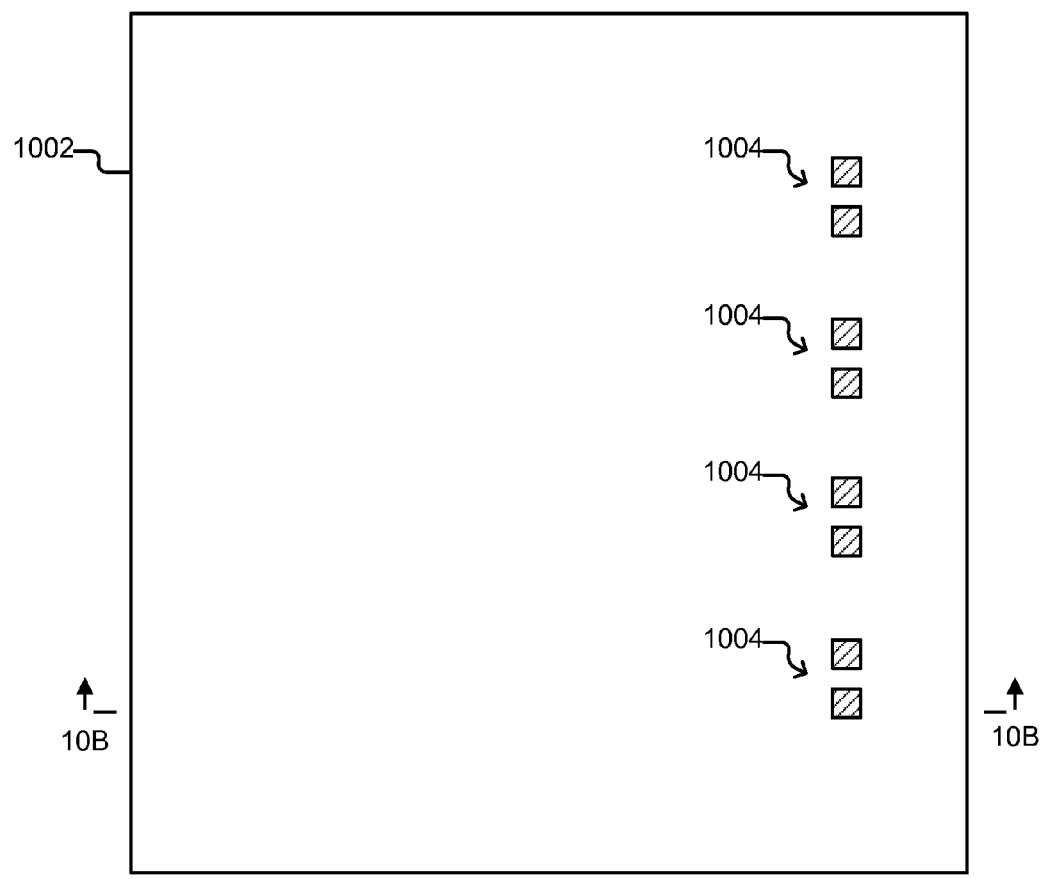
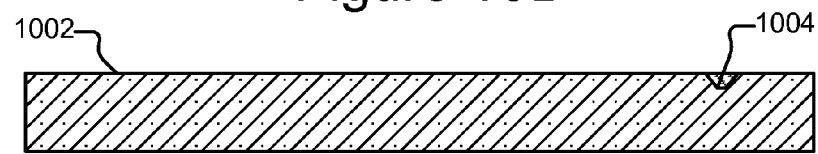

US 7,583,101 B2

PROBING STRUCTURE WITH FINE PITCH PROBES

BACKGROUND

There are many applications in which a plurality of relatively small or micro sized probes are used to contact or "probe" an object or device. One such application is testing electronic devices, such as semiconductor dies. In such a testing application, electrically conductive probes contact and make temporary electrical connections with input and/or output terminals of one or more electronic devices. Test data can then be input into the electronic device or devices through the probes and response data generated by the electronic device in response to the test data can be sensed through the probes. The present invention is directed to improvements in probing apparatuses and in methods of making and using probing apparatuses.

BRIEF DESCRIPTION OF THE DRAWINGS

FIG. 2A illustrates a top view of the electronic device of FIG. 1.

FIGS. 10A-15B illustrate an exemplary process for making the electronic device of FIG. 1 according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

Figure 1:
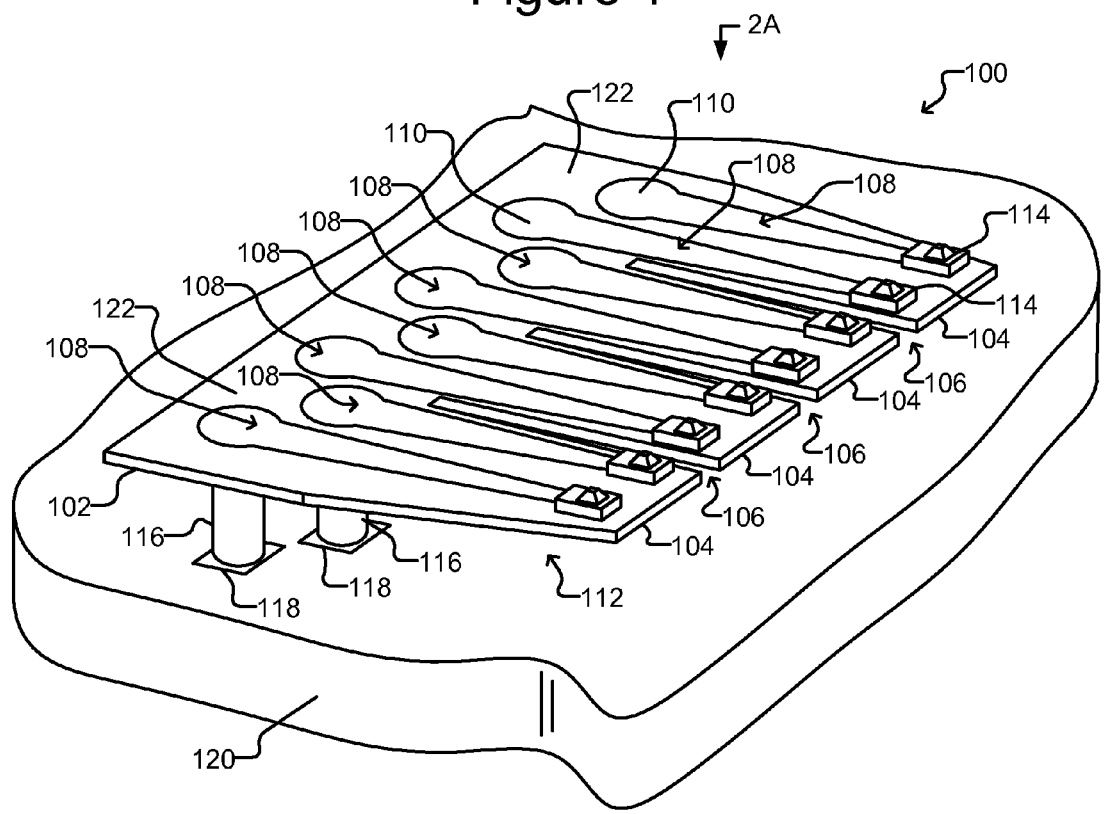
FIG. 1 illustrates a perspective partial view of an exemplary electronic device with a probing structure according to some embodiments of the invention.
Figure 2B:
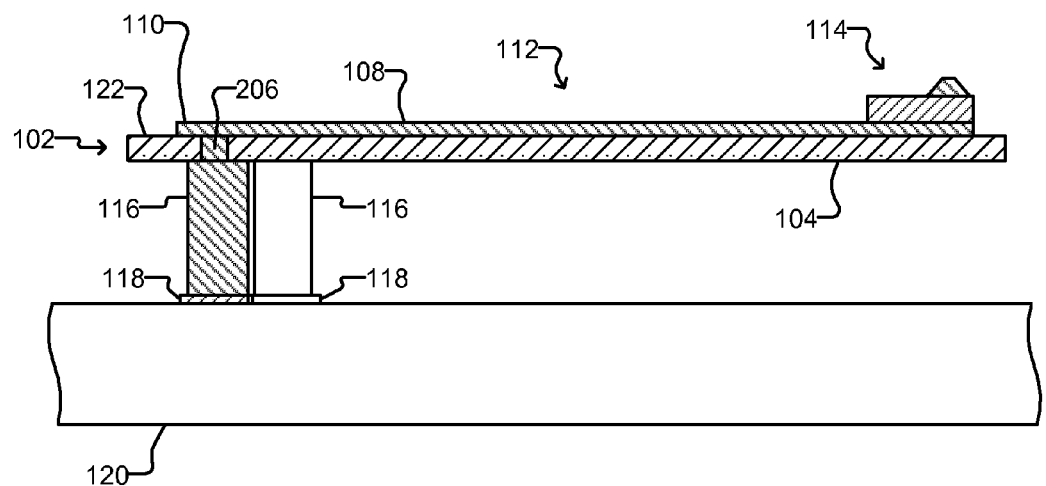
FIGS. 2B and 2C illustrate side, cross-sectional views of the electronic device of FIG. 1.
Figure 2C:
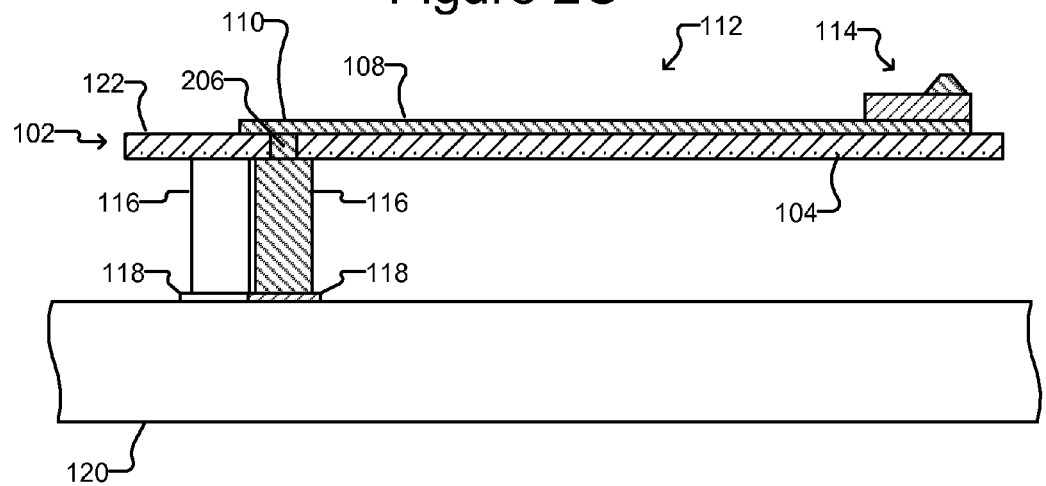

FIGS. 1-2C illustrate an exemplary electronic device 100, which can comprise a probing structure 112 (which can be a non-limiting example of a microelectronic resilient structure) attached to a substrate 120 (which is shown in partial view only in FIGS. 1-2C and which can be a non-limiting example of a first substrate) according to some embodiments of the invention. As best seen in FIGS. 1 and 2A, the probing structure 112 can comprise a platform 102 comprising a base portion 122 and a plurality of beam portions 104 (which, as shown can be cantilevered and which can be non-limiting examples of beams) separated by spaces 106. As shown, the beam portions 104 can extend from the base portion 122. Although the platform 102 is shown as having four beam portions 104 and three spaces 106, more or fewer beam portions 104 and spaces 106 can alternatively be used. Substrate 120 is shown in partial view, and more than one probing structure 112 can be attached to a substrate 120.

Electrically conductive traces 108 (which can be non-limiting examples of conductive members) can be disposed on and/or within the platform 102. For example, as shown, traces 108 can extend from the base portion 122 of the platform 102 onto and generally along a length of the beam portions 104. A plurality of traces 108 can be disposed on one or more of the beam portions 104. Although two traces 108 are shown on each beam portion 104 in FIGS. 1 and 2A, more or fewer traces 108 can be disposed on any one or more of the beam portions 104.

As shown, electrically conductive contact tips 114 (which can be non-limiting examples of contact elements) can be disposed on each trace 108. (A contact tip 114 disposed on a trace 108 can be a non-limiting example of a probe.) Although each tip contact 114 in FIGS. 1-2C is illustrated as comprising a truncated pyramid tip attached to a pedestal, contact tips 114 can comprise other shapes and elements. For example, the contact element can comprise pyramid shapes, blade shapes, etc.

As best seen in FIGS. 2B and 2C, each trace 108 can be electrically connected by an electrically conductive via 206 (which can be a non-limiting example of a conductive path or connection) through the base portion 122 of the platform 102 to an electrically conductive post 116 (which can be an example of a support member), which can be attached to, and thus electrically connected to an electrically conductive terminal 118 of the substrate 120. As shown, each trace 108 can comprise a connection feature 110 that facilitates connection of the via 206 to the trace 108. Although each trace 108 is shown in FIGS. 1-2C as electrically connected (through via 206) to one post 116, which is attached to one terminal 118, each trace 108 can alternatively be electrically connected to a plurality of posts 116 and/or a plurality of posts 116 can be attached to one terminal 118. As another alternative, more than one via 206 can connect a trace 108 to a post 116 or posts 116.

The posts 116 can comprise any post, column, or base structure. For example, each post 116 can comprise a wire, which can be bonded, soldered, brazed, or otherwise attached to a terminal 118 and the platform 102 (see FIGS. 2B and 2C). Optionally, the wire can be over coated with one or more materials to impart desired characteristics to the post 116. For example, the wire can be over coated with a hard, resilient material to impart hardness and/or resilience to the post 116. As another example, the wire can alternatively or additionally be coated with a material that has a high electrical conductivity. Posts 116 need not comprise wires. For example, each post 116 can alternatively comprise one or more materials deposited onto the platform 102 or the substrate 120 in a pattern or subsequently patterned to form a post 116.

Each contact tip 114 can thus be electrically connected through a trace 108, a via 206, and a post 116 to a terminal 118 of the substrate 120. The substrate 120 can be any substrate suitable for supporting the probing structure 112. For example, the substrate 120 can comprise a wiring substrate that includes surface or interior wiring (e.g., in the form of electrically conductive vias and/or traces disposed on and/or within the substrate 120) that electrically connect terminals 118 to other terminals (not shown) that are part of the substrate 120 and/or to electronic components or devices on or in the substrate 120. Non-limiting examples of suitable substrates for substrate 120 can include a printed circuit board or a multi-layered ceramic substrate. Such a multi-layered ceramic substrate can comprise a plurality of layers of a ceramic material (not shown) on or between which can be disposed electrically conductive traces (not shown), and electrically conductive vias (not shown) can be provided between the ceramic layers to electrically connect ones of the traces.

As best seen in FIGS. 1 and 2A, pairs of traces 108 and corresponding contact tips 114 can be disposed on each beam portion 104 of the platform 102. As mentioned, however, in other configurations, more or fewer than two traces 108 and corresponding contact tips 114 can be disposed on each beam portion 104. For example, one trace 108 with one contact tip 114 can be disposed on some beam portions 104. As another example, three, four, five, or more traces 108 can be disposed on one beam portion 104.

Figure 3A:
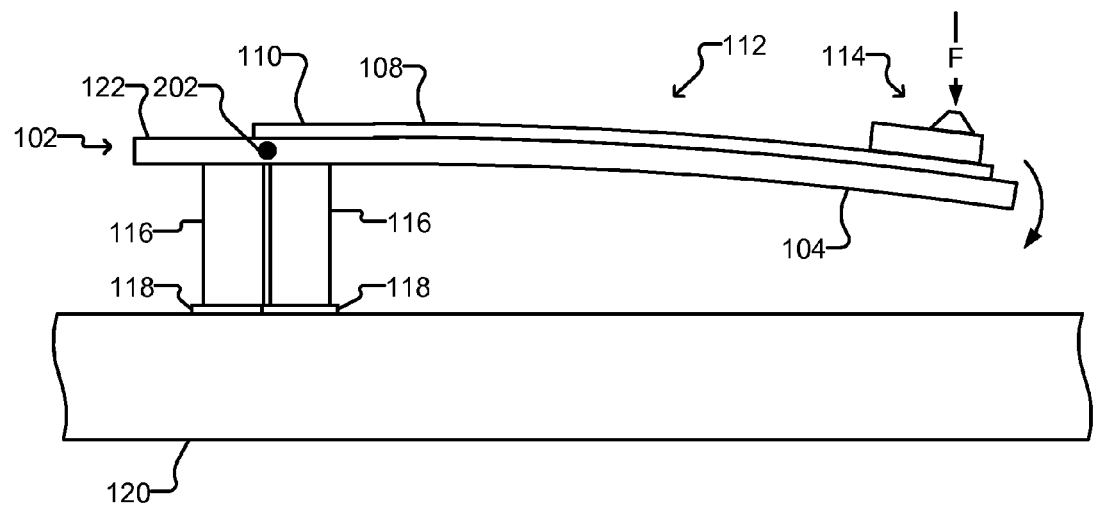
FIG. 3A illustrates exemplary bending of beam portions of the probing structure of FIG. 1 according to some embodiments of the invention.

The platform 102 can comprise a thin substrate comprising, for example, a thin film material. Examples of suitable materials for platform 102 include without limitation polyimid, polysilicon, rubber, and plastic materials as well as other materials. In some embodiments, the beam portions 104 can be flexible yet resilient. For example, as shown in FIG. 3A, which shows a side view of the electronic device 100 as indicated in FIG. 2A, each beam portion 104 can be sufficiently flexible to bend in response to application of a force F or forces F to a contact tip or the contact tips 114 on the beam portion 104. For example, each beam portion 104 can rotate about an axis 202 (e.g., a second axis) that is oriented generally through an area centroid of the connection area between the base portion 122 of the platform 102 and ones of the posts 116 and generally perpendicular to a length of the beam portions 104 as shown in FIGS. 2A and 3.

Figure 3B:
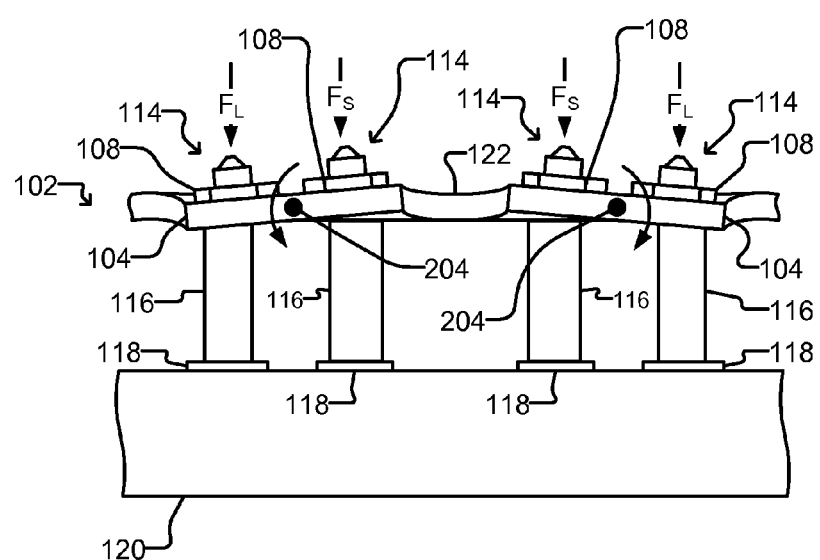
FIG. 3B illustrates exemplary twisting of beam portions of the probing structure of FIG. 1 according to some embodiments of the invention.

As shown in FIG. 3B, the flexibility of the beam portions 104 and the platform 102 generally can also allow each beam portion 104 to twist in response to application of imbalanced forces (e.g., $F_L$ and $F_S$) to the contact tips 114 on a beam portion 104. FIG. 3B shows frontal side views (as indicated in FIG. 2A) of two beam portions 104. In the non-limiting examples shown in FIG. 3B, a larger force $F_L$ is applied to one of the contact tips 114 on each beam portion 104 and a smaller force $F_S$ is applied to the other of the contact tips 114 on each beam portion 104. The flexibility of each beam portion 104 can allow the beam portion to twist in the direction of the larger force $F_L$. For example, as shown in FIG. 3B, each beam portion 104 can twist about an axis 204 (see FIGS. 2A and 4) (e.g., a first axis) that is oriented generally along a length of the beam portion 104 and located generally between the contact tips 114. Although the beam portions 104 are illustrated in FIG. 3B twisting about an axis 204 in one direction, the beam portions 104 can also twist in other directions, such as opposite the directions shown in FIG. 3B. It should be noted that the application of the forces $F_L$ and $F_S$ to particular contact tips 114 shown in FIG. 3B is exemplary only. For example, a larger force $F_L$ can be applied to the right tip 114 and a smaller force $F_S$ can be applied to the left tip 114 on the left beam portion 104 in FIG. 3B. The tips 114 of the right beam portion 104 in FIG. 3B to which the smaller force $F_S$ and the larger force $F_L$ are applied can similarly be reversed from what is shown in FIG. 3B. Of course, substantially equal forces can be applied to the tips 114 of one or more of the beam portions 104.

The platform 102 can be not only flexible but resilient (e.g., the beam portions 104 tend to return to their original positions upon removal of the force(s) that caused the bending and/or twisting illustrated in FIGS. 3A and 3B) as well. The beam portions 104 can thus have spring-properties and can exert counter-forces opposing the force(s) (e.g., like forces F, $F_L$, $F_S$) applied to the contact tips 114 of each beam portion 104. The counter-force(s) can aide in the creation and maintenance of relatively high and reliable conductive electrical connections between terminals or pads of an electronic component (not shown) that is pressed against the contact tips 114 (which can be the primary source of force(s) F, $F_L$, $F_S$).

The spaces 106 between the beam portions 104 can allow each beam portion 104 to bend as shown in FIG. 3A and/or twist as shown in FIG. 3B substantially independently of the other beam portions 104.

The platform 102 can comprise one or more materials that make the platform 102 flexible and resilient as described above. As mentioned, non-limiting examples of such material include polyimid, polysilicon, rubber, and plastic materials as well as other materials. The traces 108 can comprise one or more electrically conductive materials (e.g., metals such as copper, gold, silver, etc.) disposed on or in the platform 102, and the contact tips 114 can also comprise one or more electrically conductive materials (e.g., metals such as copper, gold, silver, etc.). The contact tips 114 can be fabricated on the traces 108 and/or the beam portions 104, or the contact tips 114 can be separately fabricated and then attached to the traces 108 and/or beam portions 104.

Figure 8A:
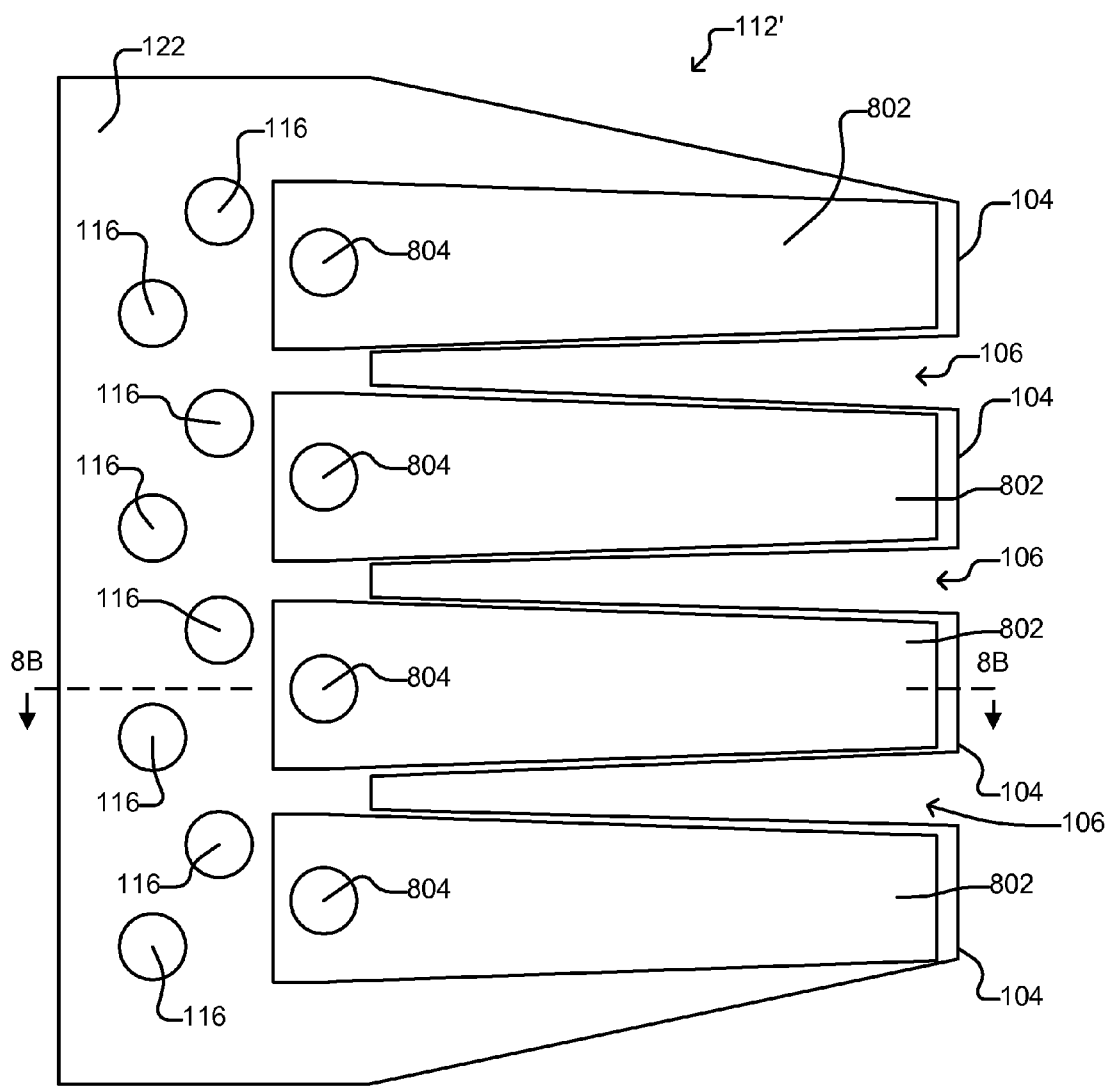
FIG. 8A illustrates a partial bottom view of exemplary modifications to the electronic device of FIG. 1 according to some embodiments of the invention.
Figure 8B:
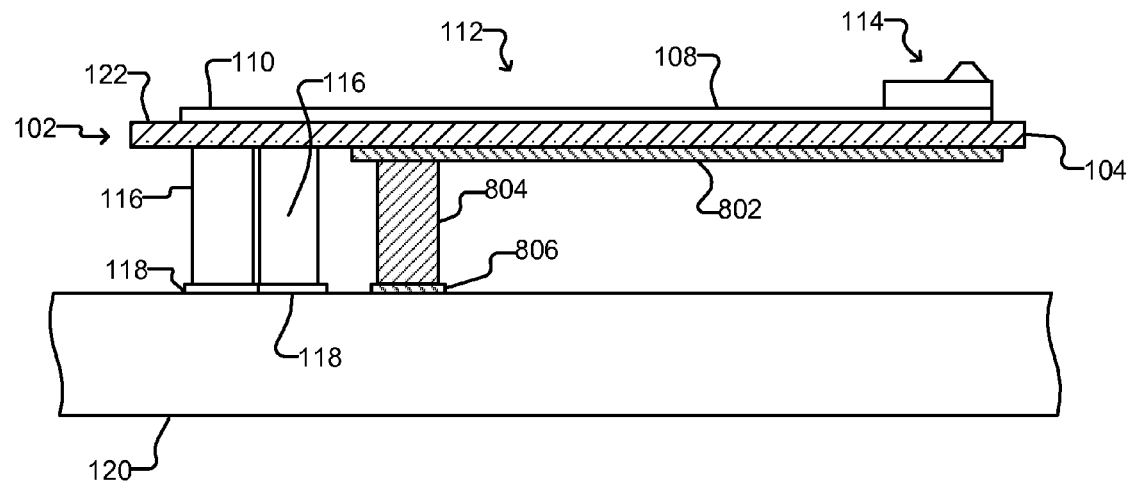
FIG. 8B illustrates a cross-sectional, side view of the modified electronic device of FIG. 8A.

The beam portions 104 can be configured to provide sufficient mechanical strength and resilience, and the traces 108 thus need provide no significant contribution of mechanical strength or resilience. Alternatively, the traces 108 can provide part, all, or substantially all of the mechanical strength and resilience needed of the beam portions 104 for a particular use or application of the electronic device 100. As yet another option, one or more additional structures (not shown) can be added (e.g., attached to beam portions 104) to provide part, all, or substantially all of the mechanical strength and resilience needed of the beam portions 104 for a particular use or application of the electronic device 100. A non-limiting example is illustrated in FIGS. 8A and 8B and discussed below.

Figure 4:
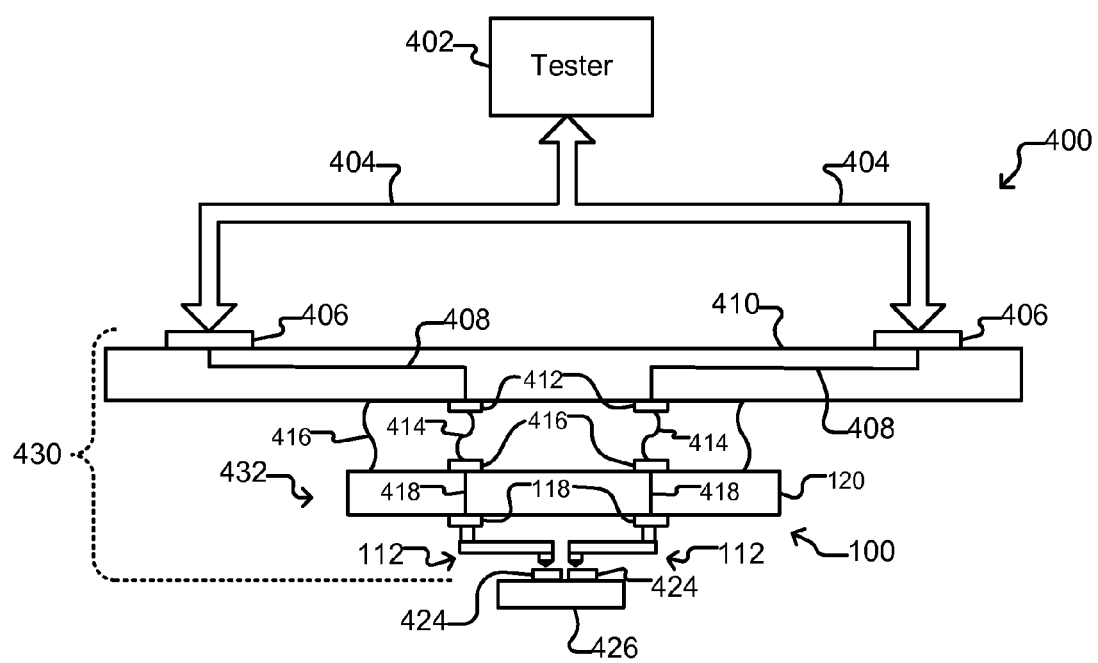
FIG. 4 illustrates an exemplary test system, and the electronic device of FIG. 1 is a probe head in the exemplary probe card assembly of the test system according to some embodiments of the invention.

There are many possible uses and applications for an electronic device, like the exemplary electronic device 100 illustrated in FIGS. 1-3B. FIG. 4 illustrates one such exemplary use. FIG. 4 illustrates an exemplary test system 400, including an exemplary probe card assembly 430 (which can be a non-limiting example of a contactor device) that can have a probe head 432 that comprises the electronic device 100 of FIGS. 1-3B according to some embodiments of the invention. That is, the test head 432 of the probe card assembly 430 shown in FIG. 4 can comprise the electronic device 100 illustrated in FIGS. 1-3B. Test system 400, including probe card assembly 430, is shown in simplified schematic and block diagram form in FIG. 4.

As shown in FIG. 4, the test system 400 can comprise a tester 402, which can be configured to control testing of one or more DUTs 426. For example, the tester 402, which can comprise one or more computers, can control functional testing of DUT 426 by generating test signals to be input into DUT 426. (The tester 402 can thus be a source of test signals.) Tester 402 can receive response signals output by the DUT 426 in response to the test signals, and tester 402 can evaluate the response signals to determine whether the DUT 426 passes the testing and/or to rate the DUT 426. For example, the tester 402 can compare the response signals to expected response signals. The tester 402 can also control other types of testing of DUT 426.

As used herein, the term "DUT" can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and/or any other type of electronic device or devices. The representation of DUT 426 with exemplary terminals 424 in FIG. 4 is thus not limited to a single device but can encompass a plurality of devices to be tested each comprising many terminals.

Test signals generated by the tester 402 can be provided to input terminals (e.g., ones of terminals 424) of the DUT 426 through a plurality of communications channels 404 and the probe card assembly 430. Response signals generated by the DUT 426 in response to the test signals can similarly be provided from output terminals (e.g., ones of terminals 424) of the DUT 426 through the probe card assembly 430 and the communications channels 404 to the tester 402.

The communications channels 404 can comprise any means suitable for providing a plurality of communications paths to and from the tester 402. For example, the communications channels 402 can comprise a plurality of electrical cables (e.g., coaxial cables), a plurality of electrical wires, a plurality of fiber optic cables, wireless transmitters and receivers, etc.

As shown in FIG. 4, the probe card assembly 430 can comprise a wiring substrate 410 (which can be a non-limiting example of a second substrate), an electrical connector 416, and a probe head 432, which can be held together by brackets (not shown), clamps, screws, bolts, and/or other suitable means. The wiring substrate 410 can include electrical connectors 406 (which can be a non-limiting example of an electrical interface or channel connections) configured to make electrical connections with communications channels 404 to and from the tester 402.

Connectors 406 can be pads for receiving pogo pins, zero-insertion-force connectors, or any other electrical connection device suitable for making electrical connections with communications channels 404. The wiring board 410 can be, for example, a printed circuit board and can include conductive paths 408 (e.g., electrically conductive traces and/or vias), which can provide electrical connections from individual electrical connections in connectors 406 (each such individual electrical connection can correspond to one of the plurality of communication channels 404) to electrically conductive pads 412 on an opposite surface of the wiring substrate 410. Electrical connections 414 that are part of the electrical connector 416 can provide electrical connections between pads 412 on the wiring substrate 410 and pads 416 on the substrate 120, which as shown in FIG. 4, can be electrically connected to terminals 118 by electrical connections 418 (e.g., electrically conductive traces and/or vias on and/or through the substrate 120).

The electrical connections 414 of the electrical connector 416 can be compliant and can comprise, for example, spring elements. In some embodiments, the electrical connector 416 can comprise an interposer substrate with electrically conductive spring contact structures extending from opposing surfaces of the interposer (not shown). In such an embodiment, the spring contacts and electrical connections through the interposer substrate between spring contacts on one surface and spring contacts on another surface of the interposer substrate can compose electrical connections 414.

Figure 5A:
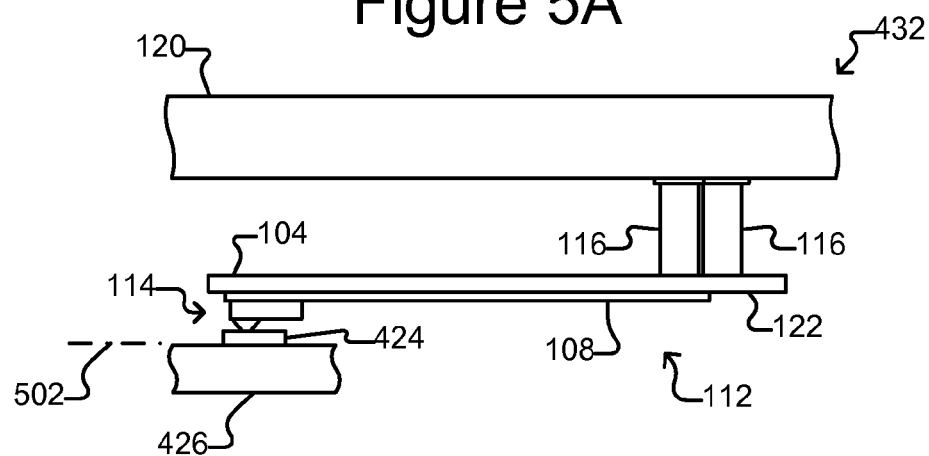
FIGS. 5A-5C illustrate bending and twisting of a beam portion of the probing structure of FIG. 1 in response to contact with DUT terminals.
Figure 5B:
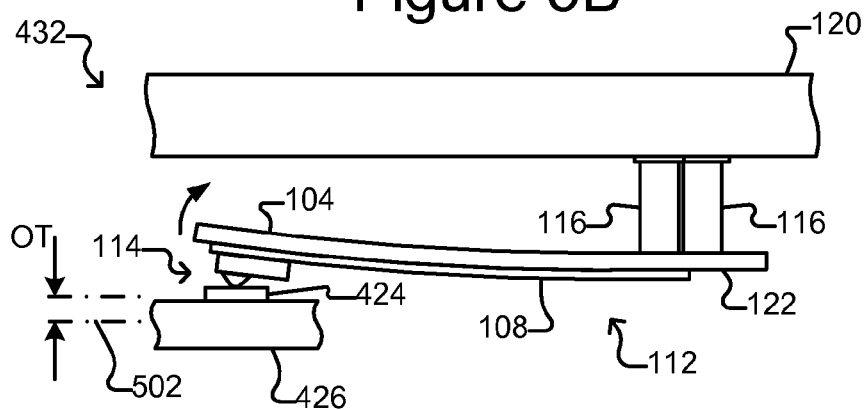
Figure 5C:
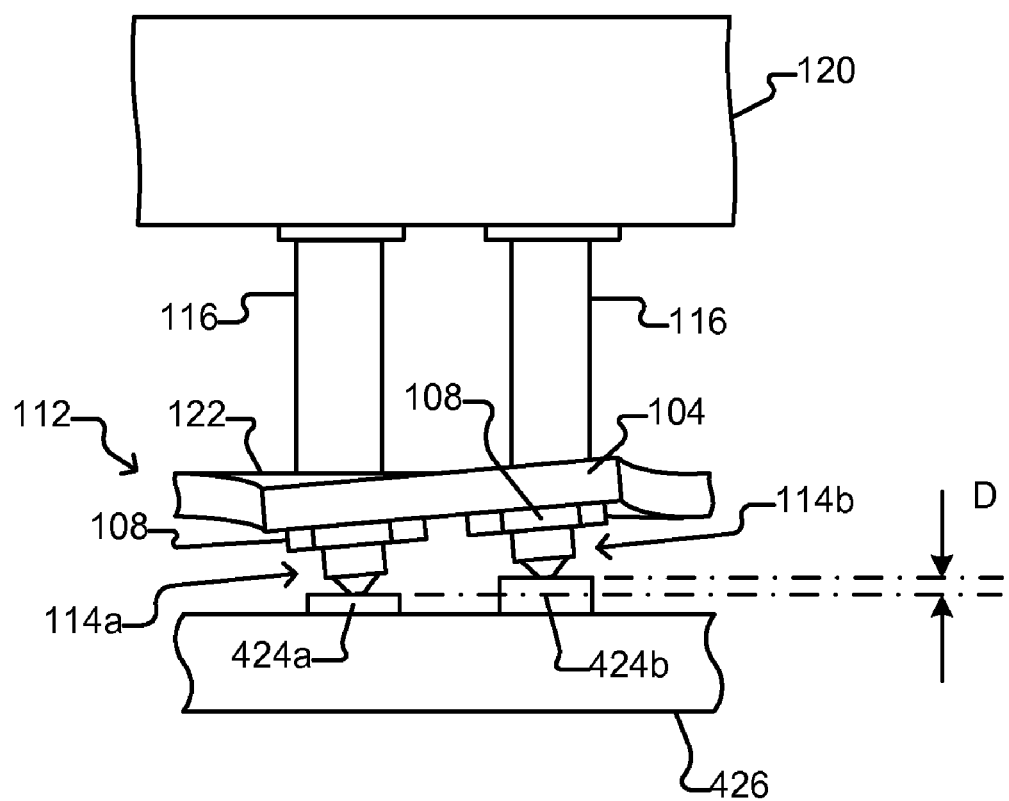

Terminals 424 of the DUT 426 and contact tips 114 of the probing structure(s) can be brought into contact one with another and moved past first contact such that the contact tips 114 and the terminals 424 are pressed against one another, which can generated forces (e.g., like F of FIG. 3A and/or $F_L$ and $F_S$ of FIG. 3B). In response, the probing structure 112 can provide two general levels of compliance (e.g., flexibility or the ability to move in response to a force or forces on the tips 114). FIGS. 5A-5C illustrate a non-limiting example. It is noted that FIGS. 5A and 5B illustrate a partial view of the probe head 432 of the probe card assembly 430 of FIG. 4, showing a side, length-wise view of one probing structure 112 contacting DUT 426, which is shown in partial view. FIG. 5C also shows partial views of the probe head 432 and DUT 426, but the view shows a side, frontal view of the probing structure 112.

As shown in FIGS. 5A and 5B, each beam portion 104 can flex as terminals 424 of DUT 426 are moved past first contact (corresponding to position 502 in FIGS. 5A and 5B) by an over travel distance (identified as OT in FIG. 5B). That is, as shown in FIG. 5A, terminals 424 of DUT 426 can be brought into first contact (corresponding to location 502) with contact tips 114. As shown in FIG. 5B, DUT 426 can be moved a distance OT past first contact (corresponding to location 502) with contact tips 114. The distance OT can be termed over travel. As shown in FIG. 5B, each beam portion 104 can bend in response to the over travel OT generally as discussed above with respect to FIG. 3A. The flexing of beam portions 104 shown in FIG. 5B can provide a global level of compliance (or flexibility) that can generally be the same for all tips 114 on a particular beam portion 104. This level of compliance can be termed global because the amount of flexing or movement can generally be the same for every tip 114 on a particular beam portion 104. The compliance provided is thus global for each beam portion 104 and does not generally vary between tips 114 on the same beam portion 104.

As shown in FIG. 5C, each beam portion 104 is also capable of providing a second, local level of compliance in response to terminals 424 of DUT 426 being moved an over travel distance OT past first contact with tips 114. As discussed above with respect to FIG. 3B, each beam portion 104 can be capable of twisting, for example, generally along an axis 204 (see FIG. 3B). This ability to twist can provide the second, local level of compliance. For example, as shown in FIG. 5C, adjacent terminals 424a, 424b on DUT 426 can have slightly different heights due to, for example, manufacturing imperfections. A difference in the heights of terminals 424a, 424b is identified in FIG. 5C as D. As shown in FIG. 5C, a particular beam portion 104 can twist so that the tips 114 on that beam portion 104 are able to accommodate the difference in heights D of terminals 424a, 424b. For example, as shown in FIG. 3C, tip 114b can be displaced a greater distance—e.g., the sum of OT and D—than tip 114a, which can be displaced distance D. The compliance provided by the foregoing ability of the beam portion 104 to twist can be termed local compliance because the amount of compliance provided to each tip 114 on the beam portion 104 can be different and can thus be custom provided locally to each tip 114 on the same beam portion 104.

Each beam portion 104 is capable of simultaneously providing both the global level of compliance and the local level of compliance described above. For example, in response to terminals 424 of DUT 426 being moved an over travel distance OT past first contact as shown in FIG. 5B, each beam can both bend as shown in FIG. 5B (which is generally as shown in FIG. 3A), and thus provide a global level of compliance to the tips 114 on the beam portion 104 as described above, and each beam portion 104 can also twist as shown in FIG. 5C (which is generally as shown in FIG. 3B), and thus provide a local level of compliance to individual tips 114 on the beam portion 104 as described above.

Referring again to FIG. 4, once terminals 424 of DUT 426 are pressed against tips 114, thereby establishing temporary electrical connections between the tips 114 and the terminals 424, tester 402 can provide test signals through channels 404 to the channel connectors 406. The test signals can be provided from the channel connectors 406 through paths 408, pads 412, and connections 414 to pads 416 on the substrate 120 and from pads 416 through electrically conductive paths 418 (e.g., electrically conductive traces and/or vias in and/or through the substrate 120) to terminals 118. As shown in FIGS. 1-2C and discussed above, individual terminals 118 can be electrically connected through a post 116, a via 206, and a trace 108 to a contact tip 114, which can be pressed against and thus make electrical contact with an input terminal (e.g., like terminals 424) of DUT 426. Test signals generated by the tester 402 can thus be provided to ones of the contact tips 114 of the probing structure 112 that are in contact with input terminals of the DUT 426.

Response signals generated by the DUT 426 in response to the test signals can be sensed by contact tips 114 of the probing structure 112 in contact with output terminals (e.g., like terminals 424) of DUT 426 and provided through the probe card assembly 430 and channels 404 to the tester 402. For example, response signals generated by the DUT 426 and output to a particular output terminal (e.g., like terminals 424) can be sensed by the contact tip 114 in contact with the output terminal and provided through a trace 108, via 206, and post 116 of the probing structure 112 to a terminal 118, and from terminal 118 through a path 418, pad 416, electrical connection 414, pad 412, a path 408 to a connection with one of the channels 404 in electrical connector 406. The tester 402 can evaluate the response signals to determine whether the DUT 426 responded properly to the test signals. For example, the tester 402 can compare the response signals to expected response signals to determine whether the DUT 426 passes the testing.

The configuration of probe card assembly 430 shown in FIG. 4 is exemplary only and is simplified for ease of illustration and discussion. Many variations, modifications, and additions are possible. For example, although the probe card assembly 430 is illustrated in FIG. 4 as having two substrates—the wiring substrate 410 and the substrate 120—the probe card assembly 430 can have more or fewer than two substrates. Other modifications are also possible. For example, substrate 120 can be attached and electrically connected directly to the wiring substrate 410 (without the need for connector 416.) As another exemplary modification of the probe card assembly 430, the probe card assembly 430 can have more than one substrate 120 with more than one probing structure 112, and each such substrate 120 can be moveable independent of the other substrate 120 or substrates 120. Non-limiting examples of probe card assemblies with multiple such probe heads are disclosed in U.S. patent application Ser. No. 11/165,833, filed Jun. 24, 2005. Additional non-limiting examples of probe card assemblies are illustrated in U.S. Pat. No. 5,974,626 and U.S. Pat. No. 6,509,751 and the aforementioned U.S. patent application Ser. No. 11/165,833, filed Jun. 24, 2005, and various features of the probe card assemblies described in those patents and application can be implemented in the probe card assembly 430 show in FIG. 4.

Figure 6:
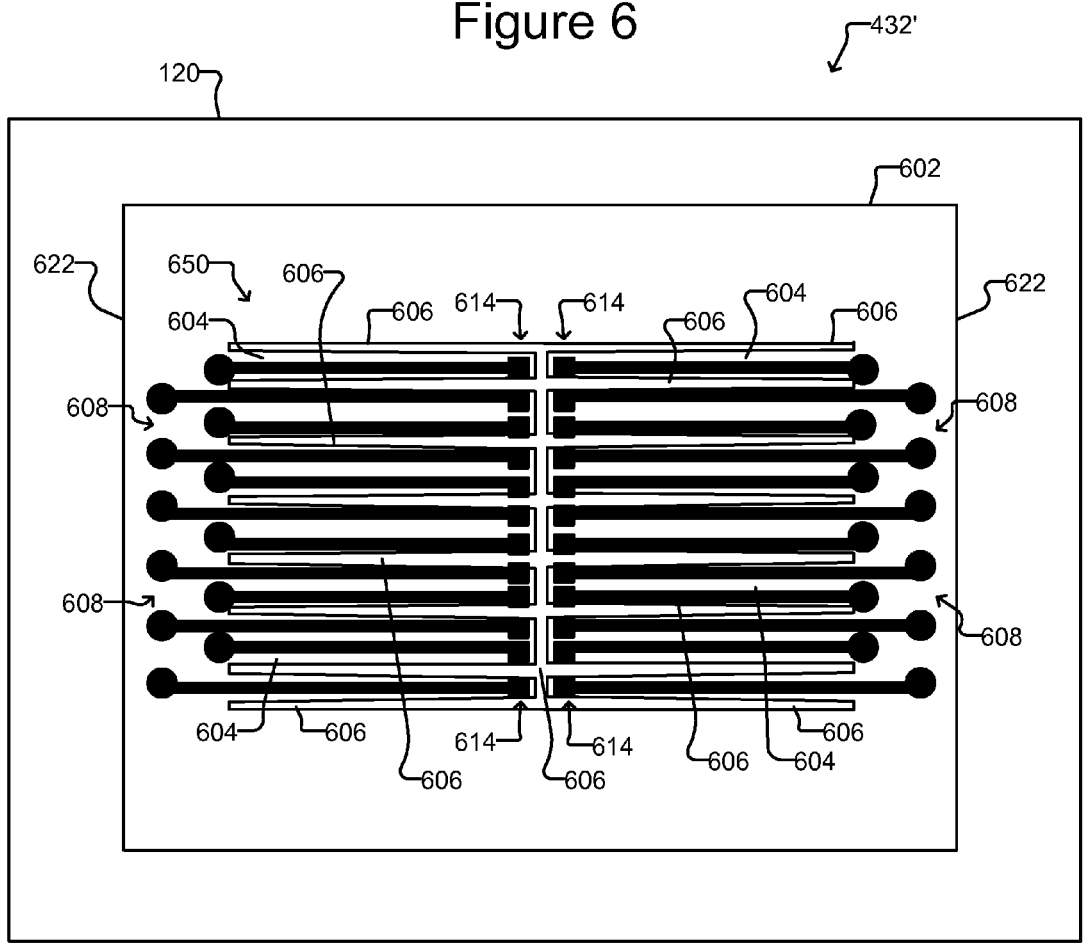
FIG. 6 illustrates a bottom view of an exemplary configuration of the probe head of the probe card assembly of FIG. 5 according to some embodiments of the invention.

FIG. 6 illustrates an exemplary configuration of the probe head 432 of FIG. 4 according to some embodiments of the invention. As shown, the probe head 432' configured as shown in FIG. 6 can include a platform 602, which can be generally the same as or similar to the platform 102 of FIGS. 1-4. A plurality of electrically conductive traces 608 can be disposed on the platform 602, and spaces 606 can be provided in the substrate 602 to form beam portions 604. As shown, the beam portions 604 can extend from base portions 622. The traces 608, spaces 606, beam portions 604, and base portions 622 can be generally the same as or similar to the traces 108, spaces 106, beam portions 104, and base portion 122 of FIGS. 1-3B. Although not shown in FIG. 6, the traces 608 can be electrically connected to posts 116 that are attached to terminals 118 of the substrate 120 (for example, generally as shown in FIGS. 1-3B). Contact tips 614 can be attached to the traces 608, and the contact tips 614 can be generally the same as or similar to contact tips 114 of FIGS. 1-3B. The contact tips 614 can be disposed in a pattern that corresponds to input and/or output terminals of a DUT (e.g., like terminals 424 of DUT 426 of FIG. 4) to be tested.

Figure 7:
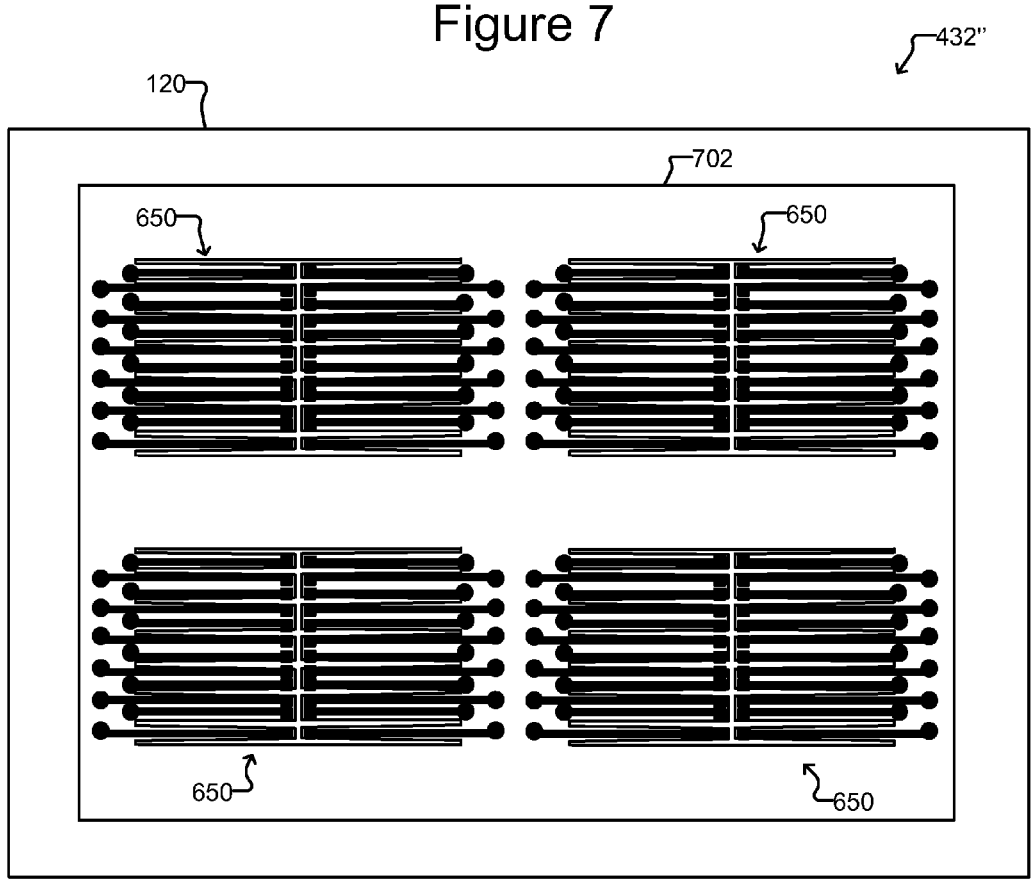
FIG. 7 illustrates a bottom view of another exemplary configuration of the probe head of the probe card assembly of FIG. 5 according to some embodiments of the invention.

The exemplary configuration of traces 608, spaces 606, beam portions 604, and contact tips 614 shown in FIG. 6 can form a probe group 650 that includes sufficient contact tips 614 to contact the input and/or output terminals (e.g., like terminals 424 of DUT 426 of FIG. 4) of a DUT to be tested. FIG. 7 illustrates another exemplary configuration of the probe head 432 of FIG. 4 according to some embodiments of the invention. As shown, the probe head 432" configured as shown in FIG. 7 can include a platform 702, which can be generally like platform 602 of FIG. 6 or platform 102 of FIGS. 1-3B. As shown, the platform 702 can include a plurality of probe groups 650, each of which can be like the probe group 650 shown in FIG. 6. In this way, probe groups 650 can be provided for contacting and testing a plurality of DUTs. Although not shown in FIG. 7 or FIG. 6, as discussed above with respect to FIG. 6, the traces 608 in the probe groups 650 can be electrically connected to posts 116 that are attached to terminals 118 of the substrate 120 (see FIGS. 1-3B) and, through probe card assembly 530, to communications channels 504 to a tester 502 (see FIG. 4).

Referring again to FIGS. 1-3B, the configuration of the electronic device 100 shown in FIGS. 1-3B is exemplary only and many variations are possible. FIGS. 8A and 8B illustrate a non-limiting example of such variations. As shown in FIG. 8A (which shows a bottom view of a modified probing structure 112' and FIG. 8B (which shows a side, cross-sectional view of the modified probing structure 112' attached to substrate 120), plates 802 (which can be non-limiting examples of structural members) can be disposed on each of the beam portions 104 of the platform 102 and can extend onto at least part of the base portion 122. The plates 802 can provide or enhance structural characteristics of each beam portion 104. For example, the plates 802 can enhance the strength of the beam portions 104. As another example, the plates can enhance resilient or spring characteristics of the beam portions 104. The material or materials composing the plates 802 can be selected to achieve desired characteristics of the beam portions 104 that are to be added or enhanced by the plates 802. For example, plates 802 can comprise a metal selected to add structural strength to the beam portions 104. As another example, plates 802 can comprise a metal selected to add resilience or spring characteristics to the beam portions 104.

In some embodiments, the plates 802 can impart substantially all of the mechanical strength and resilience of each beam portion 104. Thus, for example, the traces 108 need not provide mechanical strength or resilience, nor need the beam portions 104 of the platform 102 provide mechanical strength or resilience. Rather, all or substantially all of the mechanical strength and resilience can be provided solely by the plates 802. The plates 802 are, however, optional, and in some embodiments, the traces 108 and/or the beam portions 104 of the platform 102 can be configured to provide sufficient mechanical strength and resilience, and plates 802 need not be included in such embodiments, or plates 802 can be included solely for their electrical properties.

As also shown in FIGS. 8A and 8B, an optional electrically conductive post 804 (which can be generally the same as or similar to posts 116 of FIGS. 1-3B) can be provided to electrically connect a plate 804, which can be electrically conductive, to another terminal 806 of the substrate 120. A voltage potential (e.g., ground) can thus optionally be provided through terminal 806 and post 804 to a plate 804. The plates 804 shown in FIGS. 8A and 8B can, optionally be connected physically and/or electrically.

Figure 9:
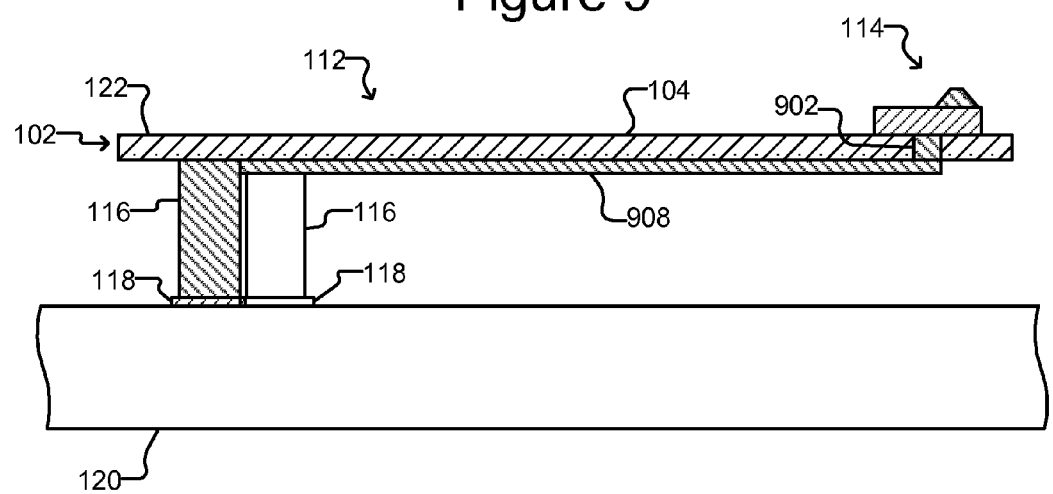
FIG. 9 illustrates a cross-sectional partial view of other exemplary modifications to the electronic device of FIG. 1 according to some embodiments of the invention.

FIG. 9 illustrates yet another exemplary variation of the electronic device 100 of FIGS. 1-3B. As shown in FIG. 9 (which shows a side, cross-sectional view similar to the view shown in FIG. 2B), conductive traces 908 (only one is visible in FIG. 9) can be disposed on a bottom surface of the beam portion 104, and the traces 908 can be electrically connected to contact tips 114 by electrically conductive vias 902 through the substrate 120. The configuration shown in FIG. 9 can thus be like the configuration shown in FIGS. 1-3B except that traces 108 on top surfaces of the beam portions 104 can be replaced in FIG. 9 by traces 908 disposed on bottom surfaces of the beam portions 104 as illustrated in FIG. 9.

FIGS. 10A-15B illustrate an exemplary method of making the electronic device 100 of FIGS. 1-2C according to some embodiments of the invention. In discussing FIGS. 10A-15B, reference will also be made to elements of the electronic device 100 shown in FIGS. 1-2C.

As shown in FIGS. 10A and 10B, a removable (or sacrificial) substrate 1002 can be provided, and as will be seen, all or part of a probing structure 112 can be fabricated on the removable substrate 1002. Although one probing structure 112 is shown being made on sacrificial substrate 1002, more than one probing structure 112 can be made on sacrificial substrate 1002. Holes can be formed in the removable substrate 1002, and as shown in FIGS. 10A and 10B, the holes can be filled to form tips 1004 of the tip structures 114 (see FIGS. 1-2C). The holes (corresponding to tips 1004) can be formed in shapes that correspond to desired shapes of the tips 1004, and the pattern of holes can correspond to a pattern of terminals of DUTs (e.g., like terminals 424 of DUT 426 in FIG. 4) to be contacted and tested. The substrate 1002 can be any substrate suitable for supporting fabrication of all or part of the probing structure 112. For example, the substrate can be a blank semiconductor (e.g., silicon) wafer. The holes in which tips 1004 are made can be formed using any method suitable for forming such holes in substrate 1002. For example, the holes can be etched, cut, stamped, ablated, etc. into the substrate 1002.

The tips 1004 can be made of any material suitable for such tips. For example, the tips 1004 can comprise one or more electrically conductive materials including, without limitation, one or more of the following: palladium, gold, rhodium, nickel, cobalt, silver, platinum, conductive nitrides, conductive carbides, tungsten, titanium, molybdenum, rhenium, indium, osmium, rhodium, copper, refractory metals, and their alloys. The material can be deposited into the openings in the sacrificial substrate 1002 to form tips 1004 in any suitable manner, including without limitation electroplating, chemical vapor deposition, physical vapor deposition, sputter deposition, electroless plating, electron beam deposition, evaporation (e.g., thermal evaporation), flame spring coating, or plasma spray coating. If the material is electroplated into the openings to form tips 1004, a thin, electrically conductive seed layer (not shown) can first be deposited into the opening, and the material forming tips 1004 can then be electroplated onto the seed layer. The seed layer (not shown) can be deposited in many different ways including many of the previously mentioned methods of depositing the material that forms tips 1004.

Figure 11A:
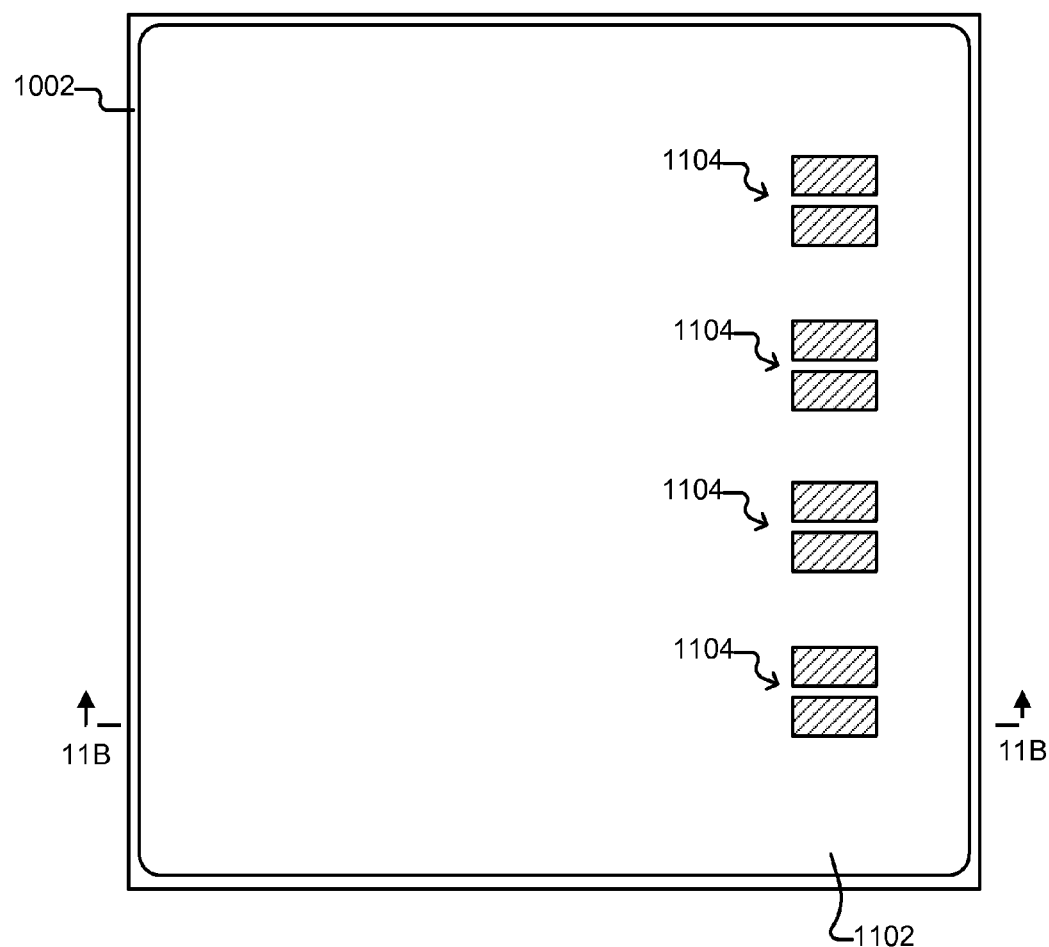
Figure 11B:
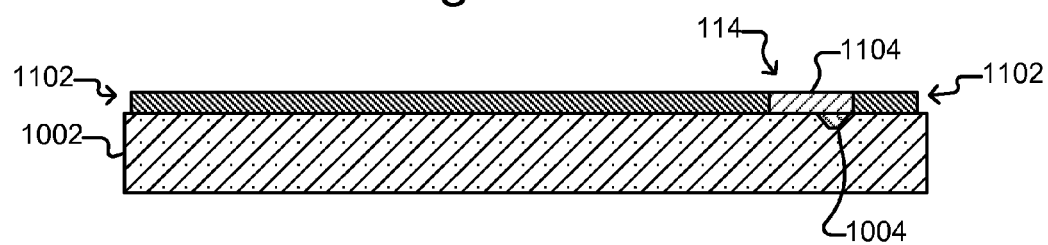

FIGS. 11A and 11B illustrate exemplary formation of pedestals 1104 of the contact tips 114 (see FIGS. 1-2C). As shown, the pedestals 1104 can be fabricated in openings patterned in a first layer 1102 of a patternable material. For example, a layer 1102 of a patternable material (e.g., a photoreactive material, such as a photo resist material) can be deposited onto the sacrificial substrate 1002 and patterned to have openings (not shown but corresponding to the pedestals 1104) in the shape and locations desired of the pedestals 1104. The first layer 1102 can, for example, comprise a photoreactive material and can be deposited into the sacrificial substrate 1002 and selectively exposed to light to harden selected portions of the material. The unhardened portions of the material can then be removed to create the openings (not shown).

Material or materials can then be deposited into the openings as shown in FIGS. 11A and 11B to form the pedestals 1104. A pedestal 1104 and a tip 1004 can form a contact tip 114 shown in FIGS. 1-2C. The material or materials that form the pedestals 1104 can be selected from any of the materials discussed above with regard to the material(s) that form the tips 1004, and the material that forms the pedestals 1104 can be deposited in any of the ways discussed above with respect to the material that forms the tips 1004. Nevertheless, the material that forms the pedestals 1104 can be different than the material that forms the tips 1004.

Figure 12A:
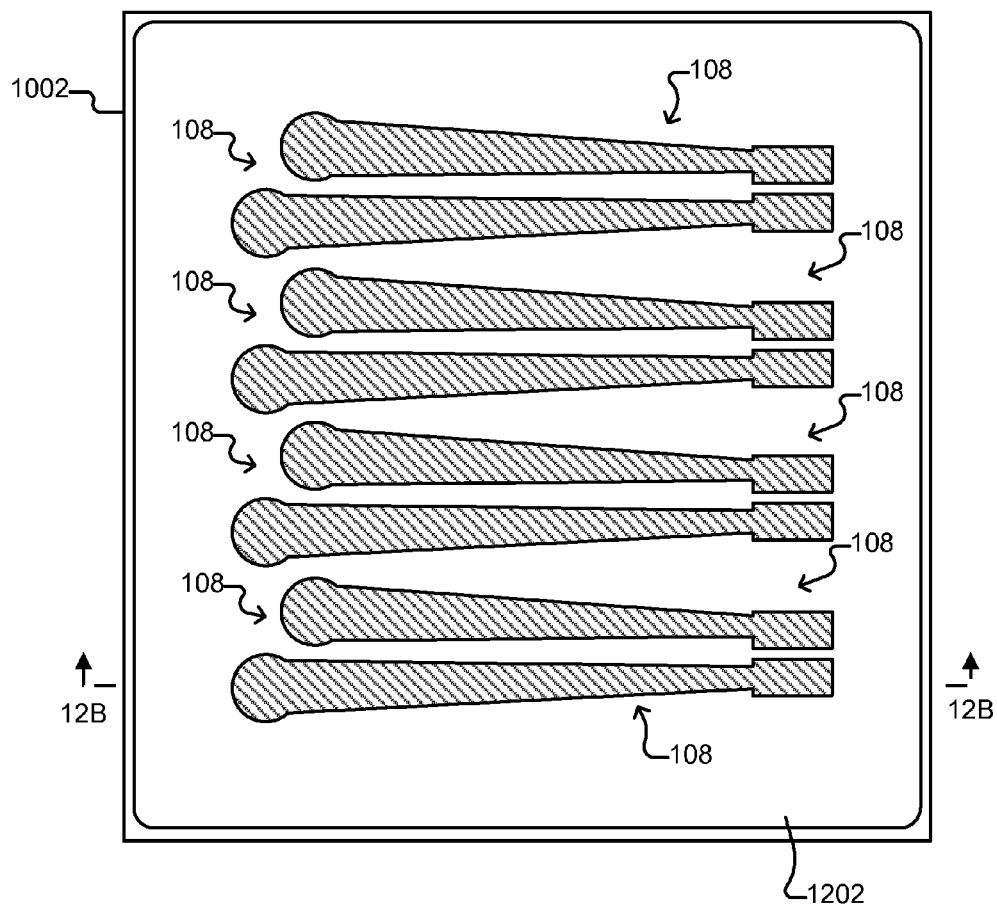
Figure 12B:
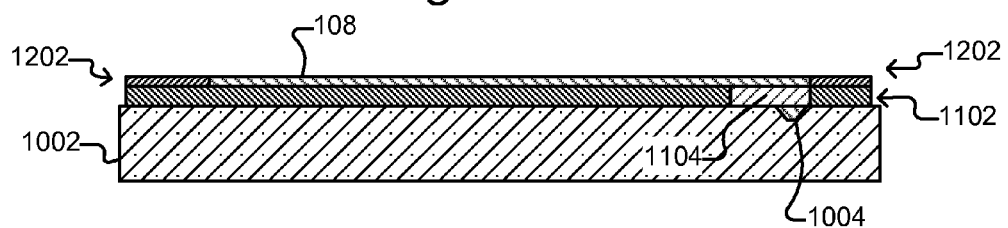

FIGS. 12A and 12B illustrate exemplary formation of traces 108 (see also FIGS. 1-2C). As shown, the traces 108 can be fabricated in openings patterned in a second layer 1202 of a patternable material, which can be like and can be deposited and patterned like the material of layer 1102. For example, the layer 1202 of patternable material can be deposited onto the first layer 1102 of pattern material and patterned to have openings (not shown but corresponding to the traces 108) in the shape and locations desired of the traces 108.

Material or materials can then be deposited into the openings in the second layer 1202 as shown in FIGS. 12A and 12B to form the traces 108. The material that forms the traces 108 can be selected from any of the materials discussed above with regard to the material(s) that form the tips 1004, and the material that forms the traces 108 can be deposited in any of the ways discussed above with respect to the material that forms the tips 1004. Nevertheless, the material that forms the traces 108 can be different than the material that forms the tip 1004.

Figure 13A:
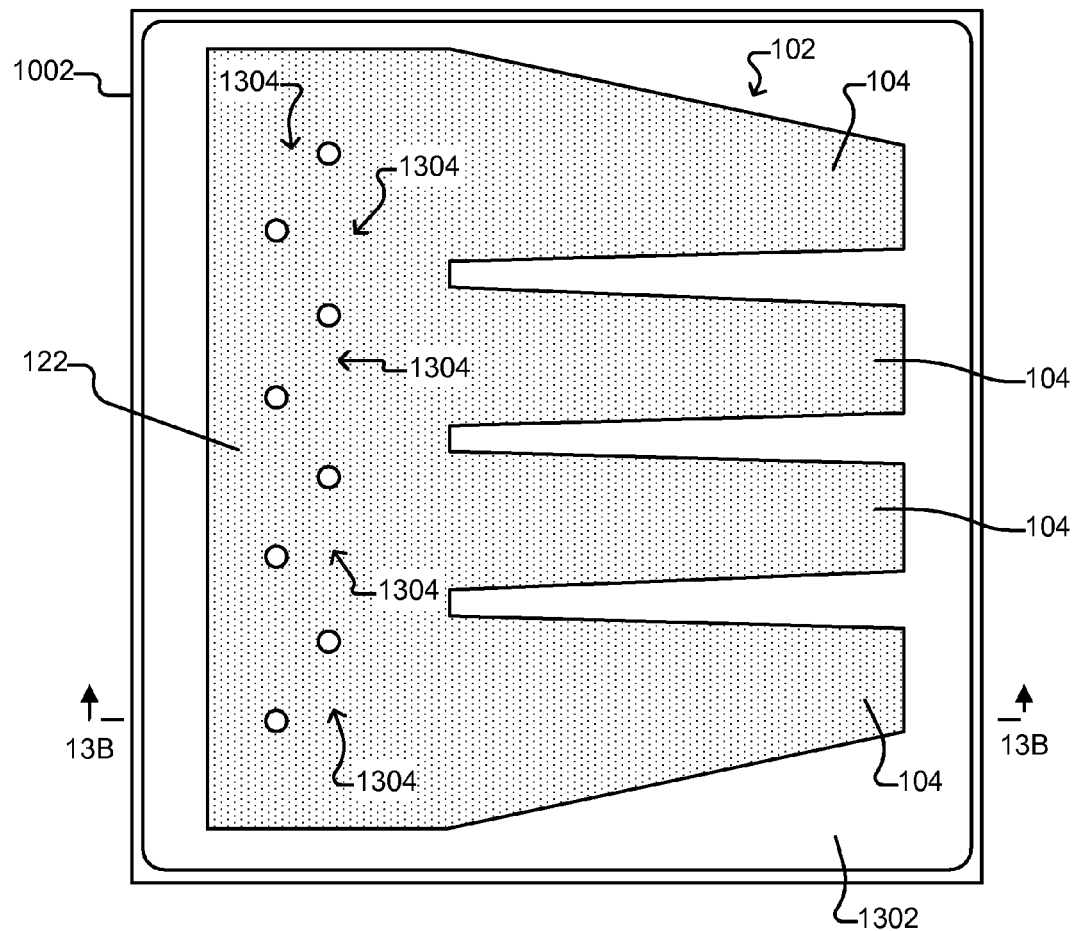
Figure 13B:
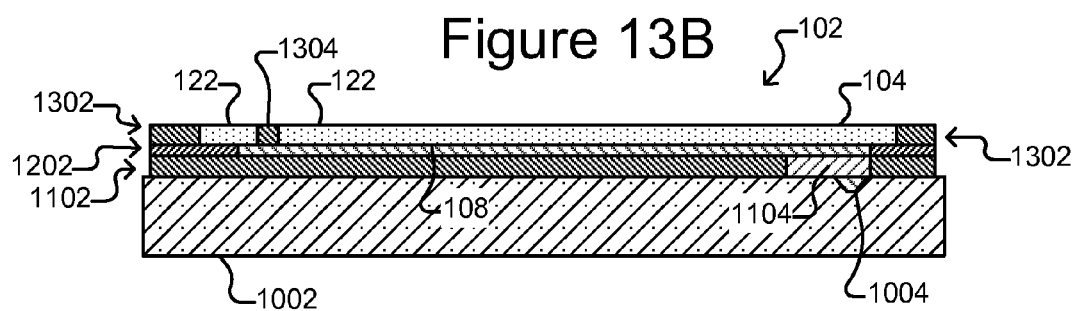

FIGS. 13A and 13B illustrate exemplary formation of the platform 102 of the probing structure 112 (see also FIGS. 1-2C). As shown, the platform 102 can be fabricated in openings patterned in a third layer 1302 of a patternable material, which can be like and can be deposited and patterned like the material of layer 1102. For example, the layer 1302 of patternable material can be deposited onto the second layer 1202 of pattern material and patterned to have openings (not shown but corresponding to the platform 102) in the shape and location desired of the platform 102. For example, the shape of the opening can define the base portion and the beam portions 104 of the platform 102. As shown in FIGS. 13A and 13B, portions 1304 of the material of the third layer 1302 can be left in shapes and locations that correspond to the shapes and locations of the vias 206 (see FIGS. 2B and 2C) that will provide electrical connections from the traces 108 through the platform 102.

The platform 102 can be made of any material or materials suitable for such a platform. Non-limiting examples of materials that can form the platform 102 include polyimid, polysilicon, rubber, and plastic materials as well as other materials. The material or materials that form the platform 102 can be deposited into the openings in the third layer 1302 of patternable material in any suitable manner. For example, the material can be poured, brushed, or otherwise deposited into the openings in the third layer 1302 of patternable material to form the platform 102.

Figure 14A:
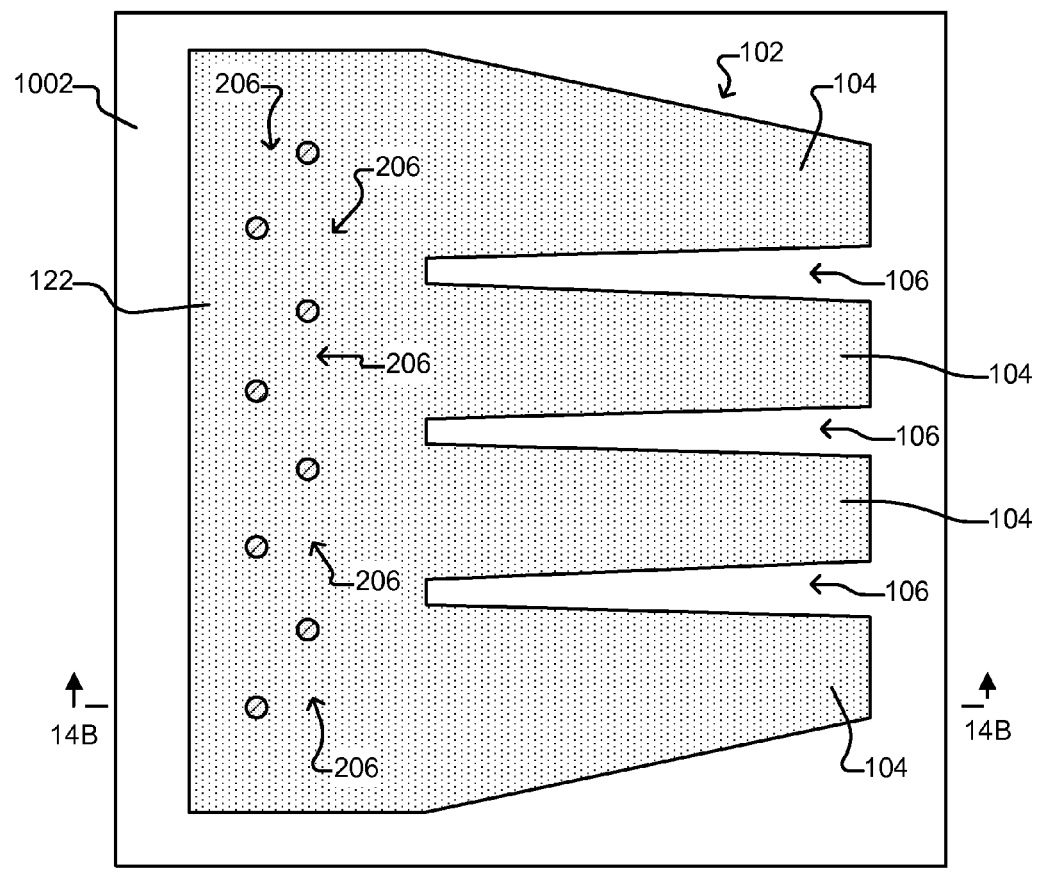
Figure 14B:
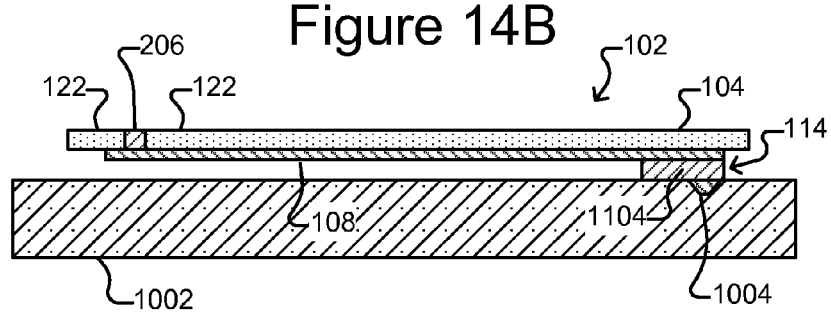

As shown in FIGS. 14A and 14B, the portions 1304 of the third layer 1302 of material can be removed, which can leave holes in the platform 102. Material or materials can then be deposited into those holes in the platform 102 to form the vias 206 (see FIGS. 2B and 2C). The material that forms the vias 206 can be selected from any of the materials discussed above with regard to the material(s) that form the tips 1004, and the material that forms the vias 206 can be deposited in any of the ways discussed above with respect to the material that forms the tips 1004. Nevertheless, the material that forms the vias 206 can be different than the material that forms the tip 1004.

Figure 15A:
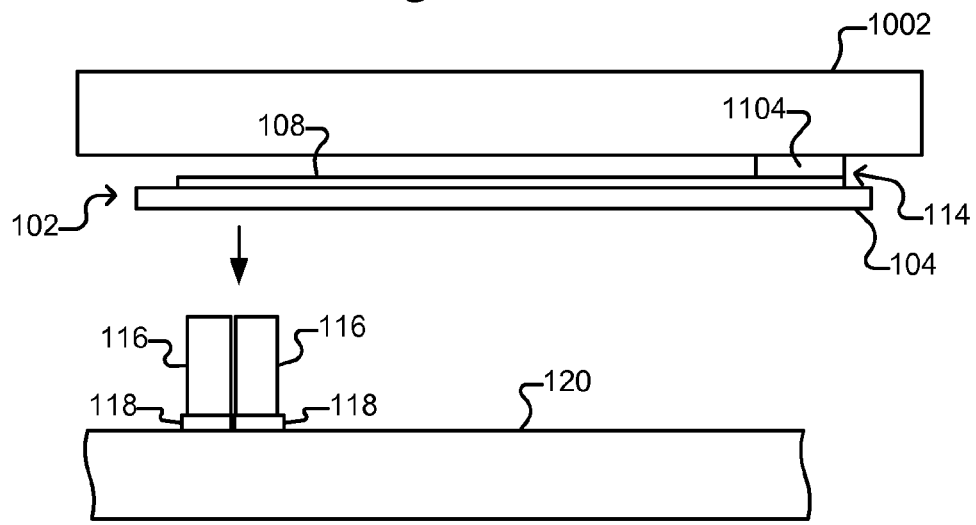
Figure 15B:
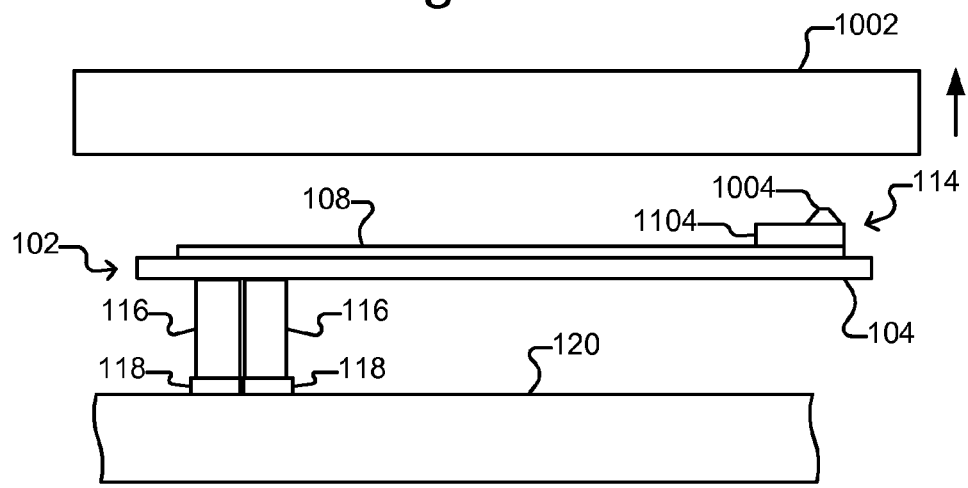

As also shown in FIGS. 14A and 14B, the first layer 1102, the second layer 1202, and the third layer 1302 of patternable material can be removed, leaving the probing structure 112 (see also FIGS. 1-2C) attached by tip structures 114 to the sacrificial substrate 1002. As shown in FIG. 15A, the platform 102 can be attached to posts 116, which as discussed above, can be attached to terminals 118 of the substrate 120. For example, the vias 206 (see FIGS. 14A and 14B) can be soldered, brazed, or otherwise attached to the posts 116. Bonding pads (not shown) comprising a generally thin, flat electrically conductive structure (e.g., like feature 110) can be provided on the platform 102 in contact with the vias 206, and the wire stems forming the posts 116 can be bonded to such bonding pads. As shown in FIG. 15B, the contact tips 114 of the probing structure 112 can be released from the sacrificial substrate 1002. For example, although not shown in FIGS. 10A-14B, a release layer of material can be deposited between the tips 1004 and the pedestals 1104, on one hand, and the sacrificial substrate 1002, on the other hand. The release layer can be any material that is easy removed (e.g., dissolved in a solvent), which can separate the tip structures 114 from the sacrificial substrate 1002, releasing the probing structure 112 from the sacrificial substrate 1002 as shown in FIG. 15B.

The posts 116 can be fabricated on the terminals 118 as shown in FIG. 15A in any of many different ways. For example, the posts 116 can comprise wire stems that are bonded, soldered, brazed, or otherwise attached to the terminals 118. The wire stems can optionally be overcoated with a material or materials to enhance the strength, resilience, electrical conductivity, or other characteristic or characteristics of the posts 116. As another example, the posts can be formed in openings patterned in one or more layers of a patternable material (e.g., like any of layers 1102, 1202, 1302) deposited onto substrate 102. As yet another example, the posts 116 can be fabricated on a sacrificial substrate (e.g., like sacrificial substrate 1002), attached to the terminals 118, and released from the sacrificial substrate).

The method of making the electronic device 100 of FIGS. 1-2C illustrated in FIGS. 10A-15B is exemplary only and many alternative methods and/or variations are possible. For example, one or more of the pedestals 1104, traces 108, and/or platform 102 need not be made in a layer (e.g., 1102, 1202, 1302) of patternable material. For example, traces 108 can be formed on layer 1102 and pedestals 1104 by depositing material forming the traces 108 through a patterned mask (not shown). As another example, the traces 108 can be formed by depositing a blanket layer of the material that forms the traces 108 onto layer 1102 and pedestals 1104 and then selectively removing portions of the blanket layer to leave material in the desired shapes and locations of the traces 108. As yet another example, the platform 102 can similarly be formed by depositing a blanket layer of the material that forms the platform 102 and then selectively removing portions of the material to leave material in the desired shape of the platform 102.

Figure 16:
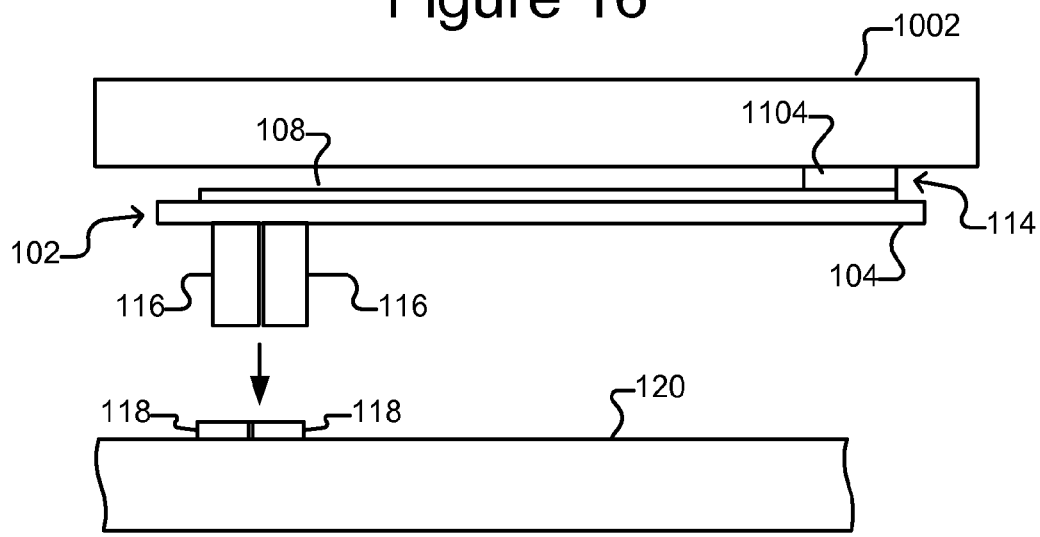
FIGS. 16 and 17 illustrate exemplary modifications to the process illustrated in FIGS. 10A-15B according to some embodiments of the invention.
Figure 17:
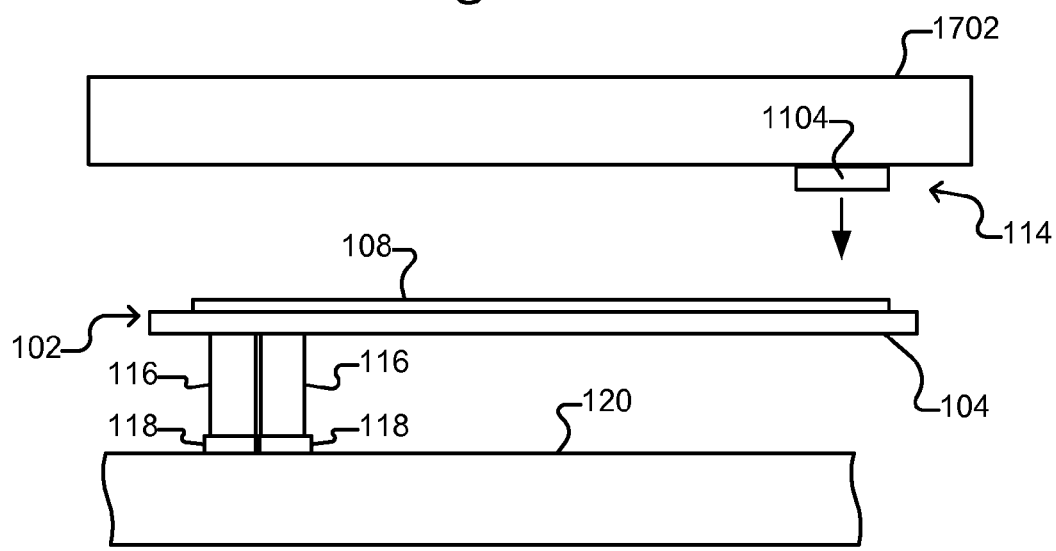

FIGS. 16 and 17 illustrate additional non-limiting exemplary variations of the process shown in FIGS. 10A-15B according to some embodiments of the invention.

In FIG. 16, posts 116 can be formed on the platform 102, after which the posts 116 can be attached to the terminals 118 and the tip structures 114 can be released from the sacrificial substrate 1002 (as discussed above). The posts 116 can be formed on the platform 102 in any of many different ways. For example, referring to FIGS. 14A and 14B, the posts 116 can be formed in openings in a fourth layer or layers (not shown) of patternable material, which can be deposited onto the third layer 1302 (see FIGS. 13A and 13B). The openings can be patterned to correspond to desired shapes and locations of the posts 116. As mentioned above, the posts 116 can be formed such that each post 116 contacts a via 206 and is thus electrically connected through a via 206 to a trace 108. The patternable material or materials that form the fourth layer or layers can be like and can be deposited and patterned like any of the layers 1102, 1202, 1302. In addition, the material or materials that form the posts 116 can be selected from any of the materials discussed above with regard to the material(s) that form the tips 1004, and the material that forms the posts 116 can be deposited in any of the ways discussed above with respect to the material that forms the tips 1004.

Nevertheless, the material that forms the posts 116 can be different than the material that forms the tips 1004.

Rather than form the posts 116 in a fourth layer or layers of a patternable material, posts 116 can be formed on the platform 102 by bonding wire stems to the platform 102. For example, wire stems can be bonded to the vias 206 shown in FIGS. 14A and 14B. As mentioned above, bonding pads (not shown) comprising a generally thin, flat electrically conductive (e.g., like feature 110) structure can be provided on the platform 102 in contact with the vias 206, and the wire stems forming the posts 116 can be bonded to such bonding pads. As also mentioned above, such wire stems (not shown) can be overcoated with one or more materials to enhance mechanical, electrical, or other characteristics of the posts 116.

FIG. 17 illustrates an exemplary variation of the method illustrated in FIGS. 10A-15B in which the tip structures 114 are formed on a sacrificial substrate 1702 (which can be like sacrificial substrate 1002), joined to traces 108, and released from the sacrificial substrate 1702. The posts 116 and platform 102 with traces 108 shown in FIG. 17 can be fabricated and attached to the substrate 120 in any manner described herein. For example, the posts 116 can be fabricated on the terminals 118. The platform 102 with traces 108 can be fabricated on a sacrificial substrate (e.g., like sacrificial substrate 1002) in a process that is similar to the process illustrated in FIGS. 10A-15B except that tip structures 114 are not fabricated on the sacrificial substrate. The platform 102 with traces 108 can then be attached to the posts 116 and released from the sacrificial substrate. The tip structures 114, which can be fabricated on sacrificial substrate 1702 shown in FIG. 17, can then be attached (e.g., soldered, brazed, or otherwise attached) to the traces 108, and the tip structures 114 can then be released from the sacrificial substrate 1702. The tip structures 114 can be fabricated on sacrificial substrate 1702 in the manner generally shown in FIGS. 10A-11B.

Regardless of the method by which such probe assemblies are made, the probe assemblies can be made with tailored electrical and/or mechanical characteristics. FIGS. 18-20 illustrate non-limiting examples.

Figure 18A:
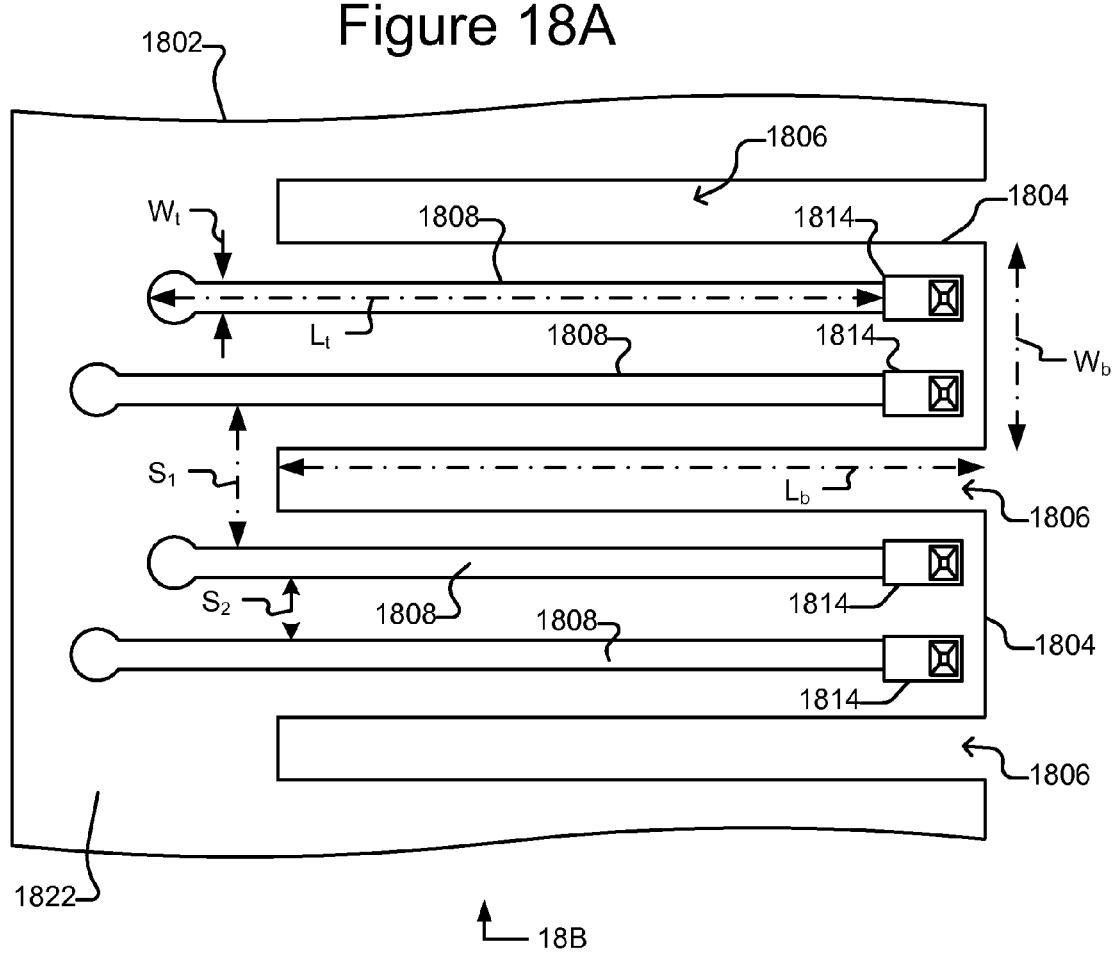
FIGS. 18A and 18B illustrate partial top and side views, respectively, of a platform with beam portions and traces in which the shape and dimensions of the traces and the beam portions can be tailored to achieve desired electrical and mechanical characteristics according to some embodiments of the invention.
Figure 18B:
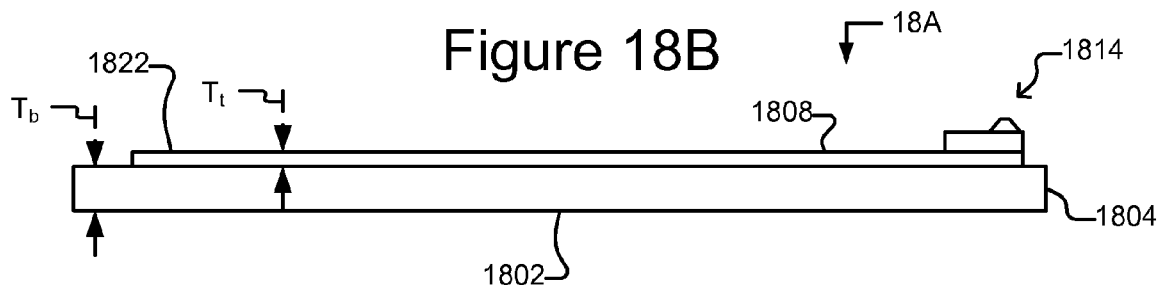
Figure 19:
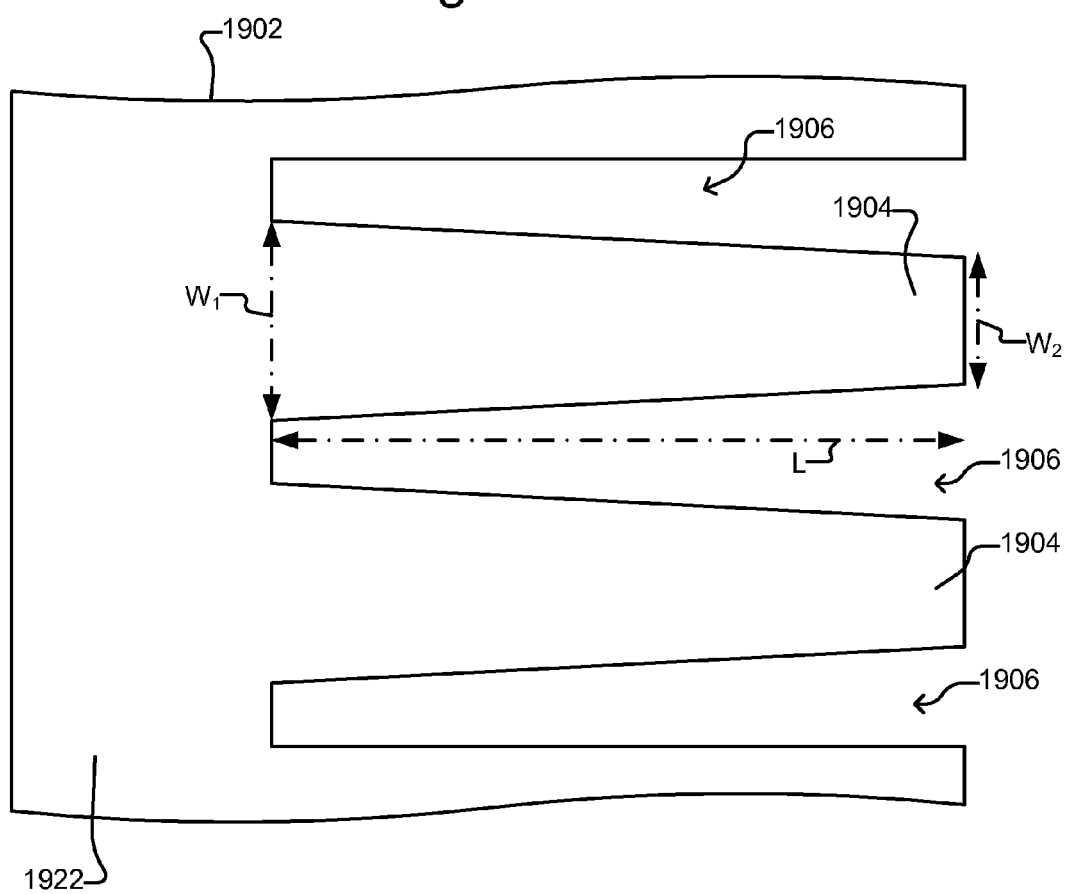
FIG. 19 illustrates a partial top view illustrating an example in which the shape and dimensions of beam portions can be selected to achieve a desired mechanical characteristic according to some embodiments of the invention.

FIG. 18A shows a partial top view and FIG. 18B shows a side view of a platform 1802 that includes a base portion 1822 and beam portions 1804 separated by spaces 1806. As shown, contact tips 1814 can be disposed on the beam portions 1084. The platform 1802, base portion 1822, beam portions 1804, spaces 1806, and contact tips 1814 can be generally similar to the platform 102, beam portions 104, spaces 106, and contact tips 1814 in FIGS. 1-2C.

In the example shown in FIGS. 18A and 18B, the shape of traces 1808 can be selected to achieve a selected or desired electrical characteristic. As shown, the width $W_t$, the length $L_t$, and the thickness $T_t$ of each trace 1808 can be selected to impart a desired electrical characteristic to each trace. In other words, each trace 1808 can be designed and made to have a selected or a predetermined width $W_t$, length $L_t$, and thickness $T_t$ in order to impart a selected, predetermined, or desired electrical characteristic to the trace 1808. For example, each trace can be designed (its width $W_t$, length $L_t$, and thickness $T_t$ selected) to have a particular impedance (or resistance). For example, generally speaking, the greater the width $W_t$, and/or the thickness $T_t$ of a trace 1808, the smaller the impedance or resistance of the trace 1808. Similarly, the longer the length $L_t$ of a trace 1808, the greater the impedance or resistance of the trace 1808.

In the example shown in FIGS. 18A and 18B, each beam portion 1804 can also be designed to have one or more desired mechanical properties. As shown, the width $W_b$, the length $L_b$, and the thickness $T_b$ of each beam portion 1804 can be selected to impart a desired mechanical characteristic to each beam portion 1804. In other words, each beam portion 1804 can be designed and made to have a selected or a predetermined width $W_b$, length $L_b$, and thickness $T_b$ in order to impart a selected, predetermined, or desired mechanical characteristic or characteristics to the beam portion 1804. For example, each beam portion 1804 can be designed (its width $W_b$, length $L_b$, and thickness $T_b$ selected) to have a particular spring constant, which according to Hooke's law can be k=F/d (where k is the spring constant, F is a force or the sum of forces applied to the tip structures 1814 on the beam portion 1804, and d is the distance the beam portion 1804 deflects in response to the force or sum of forces F). For example, generally speaking, the greater the width $W_b$, and/or the thickness $T_b$ of a beam portion 1804, the greater spring constant (k) of the beam portion 1804. Similarly, the longer the length $L_b$ of a beam portion 1804, the smaller the spring constant (k). As shown in FIGS. 8A and 8B and discussed above, alternatively or additionally, one or more additional structures (e.g., like plates 804) can be attached to all or part of the platform 1802 to provide part of or all or substantially all of the mechanical strength and/or resilience of beam portions 1804. The material, dimensions, and positions of such additional structures can likewise be tailored to provide desired levels of strength and/or resilience.

As also shown in FIG. 18A, a pair of traces 1808 disposed on a beam portion 1804 can be spaced S2 sufficiently close to function as a differential pair of transmission lines (e.g., a differential signal line pair). For example, the spacing $S_2$ between traces 1808 on the same beam portion 1804 can be closer than the spacing $S_1$ between traces 1808 on different beam portions 1804 so that the differential coupling between traces 1808 on the same beam portion 1804 is greater than a differential coupling between traces 1808 on different beam portions 1804. The probing structures (e.g., like probing structure 112) disclosed herein can thus optionally be used to transmit signals differentially. Thus, for example, pairs of traces 108 on the same beam portion 104 in the probing structure 112 of FIGS. 1-2C can be configured as differential transmission path pairs. The posts 116, vias 206, and terminals 118 to which the traces 108 are connected can likewise be configured as differential transmission path pairs. In some configurations, the paths 408, pads 412, connections 414, pads 416, and connections 418 to the terminals 118 within probe card assembly 430 (see FIG. 4) can also be configured as differential transmission path pairs so that one or more signals can be provided between connectors 406 and DUT 426 using differential signal transmission techniques. As yet another option, ones of the channels 404 can be configured as differential transmission path pairs so that one or more signals can be transmitted between the tester 402 and the DUT 426 using differential signal transmission techniques.

As is known, an electric signal (e.g., representing a digital data bit) can be transmitted over a first signal transmission path (e.g., comprising one of the traces 1808 on a beam portion 1804) and the compliment of the electronic signal can be transmitted over a second signal transmission path (e.g., comprising another of the traces 1808 on the same beam portion 1804) that is disposed in sufficient proximity to the first signal transmission path to form a differential transmission path pair. As is also known, a signal transmitted over a differential transmission path pair can be less susceptible to noise or other forms of electrical and/or magnetic interference than a signal transmitted over a single transmission path.

FIG. 19, which illustrates a top partial view of a platform 1902 with spaces 1906 between beam portions 1904 that extend from a base portion 1922, shows another example in which the shape of the beam portions 1904 can be selected to impart desired mechanical characteristics to the beam portions 1904. As shown, a beam portion 1904 can have a first width $W_1$, a second width $W_2$, a length L, and thickness (not shown in FIG. 19 but which can be the same thickness dimension $T_b$ illustrated in FIG. 18B). For example, particular values for the first width $W_1$, the second width $W_2$, the length L, and the thickness of each beam portion 1904 can be selected in order to impart a desired mechanical property (e.g., spring constant k) to the beam portion 1904. Although not shown in FIG. 19, traces (e.g., like traces 108 or 1808) can be disposed on beam portions 1904, for example, as shown in FIGS. 18A and 18B. The platform 1902, base portion 1922, and beams 1904 can be generally similar to the platform 102, base portion 122, and beams 104 of FIGS. 1-2C.

Using the foregoing principles, a probing structure (e.g., like probing structure 112 shown in FIGS. 1-2C) can be made with beam portions (e.g., like 104) that have one or more desired mechanical characteristics, and electrically conductive traces (e.g., like traces 108) on the beam portions can be made to have one or more desired mechanical characteristics. Moreover, the shape, design, etc., and thus the mechanical characteristics, of the beam portion, can have little to no effect on the electrical properties of the traces on the beam portion, and the shape, design, etc., and thus the electrical properties, of the traces can have little to no effect on the mechanical properties of the beam portion.

Although specific embodiments and applications of the invention have been described in this specification, there is no intention that the invention be limited these exemplary embodiments and applications or to the manner in which the exemplary embodiments and applications operate or are described herein.

I claim:

1. A microelectronic resilient structure comprising:
   a substrate comprising a surface;
   a support member attached at a first end to the surface of the substrate and extending away from the substrate to a second end;
   a platform attached to the second end of the support member and comprising a non-conductive, resilient beam that is suspended above, spaced apart from, and generally parallel to the surface of the substrate, wherein the beam extends away from the support member to a free end of the beam that is rotatable toward the surface of the substrate;
   a plurality of conductive members disposed on and extending along a length of the beam; and
   a plurality of conductive contact elements each disposed on the beam adjacent the free end of the beam and electrically connected to one of the conductive members.

2. The resilient structure of claim 1 wherein a first of the plurality of conductive members is electrically isolated from a second of the plurality of conductive members.

3. The resilient structure of claim 2 further comprising:
   a plurality of support members each comprising a first end attached to the surface of the substrate and extending away from the surface to a second end to which the platform is attached; and
   a plurality of conductive paths passing through the platform,
   wherein one of the paths electrically connects the first conductive member to one of the support members, and another of the paths electrically connects the second conductive member to another of the support members.

4. The resilient structure of claim 1 wherein two of the conductive members are configured as a differential pair of transmission paths.

5. The resilient structure of claim 1 wherein a shape of each conductive member is selected to impart a selected electrical characteristic to the conductive member.

6. The resilient structure of claim 5 wherein the electrical characteristic is impedance.

7. The resilient structure of claim 1 wherein a shape of the beam is selected to impart a selected spring constant to the beam.

8. The resilient structure of claim 7 wherein a shape of each conductive member is selected to impart a selected electrical characteristic to the conductive member.

9. The resilient structure of claim 7 wherein shapes of the conductive members have substantially no effect on the spring constant of the beam, and a shape of the beam has substantially no effect on electrical characteristics of the conductive members.

10. The resilient structure of claim 1 further comprising a structural member attached to the beam, the structural member increasing a spring constant of the beam.

11. The resilient structure of claim 10 wherein:
    the structural member is electrically conductive, and
    the resilient structure further comprises an electrically grounded support member attached to the structural member.

12. The resilient structure of claim 1, wherein:
    the platform comprises a base portion and a plurality of non-conductive, resilient beams extending away from the base portion,
    multiple ones of the beams have multiple ones of the conductive members disposed thereon;
    multiple ones of the contact elements are disposed on one of the beams and electrically connected to multiple ones of the conductive members;
    the resilient structure further comprises:
       a plurality of support members each attached at a first end to the surface of the substrate and extending away from the surface to a second end to which the base portion is attached; and
       a plurality of electrically conductive connections electrically connecting ones of the conductive members to ones of the support members.

13. The resilient structure of claim 1, wherein the beam is configured to twist about a first axis that is disposed between two of the conductive members disposed on the beam and generally parallel to a length of the beam.

14. The resilient structure of claim 13, wherein the beam is further configured to bend about a second axis that passes through the support member and is generally perpendicular to the first axis as the free end of the beam rotates toward the surface of the substrate.

15. A probe card assembly comprising:
    a first substrate comprising a surface;
    a platform comprising a base and a plurality of cantilevered beams, each of the beams being suspended above, spaced apart from, and substantially parallel to the surface of the substrate and extending from the base to a free end of the beam that is rotatable toward the surface of the substrate, the base and the beams being substantially electrically insulating;
    a plurality of support members, wherein each of the support members is attached at a first end to the surface of the first substrate and extends away from the surface to a second end that is attached to the base of the platform;

a plurality of conductive test probes attached to and extending along a length of multiple ones of the beams, each test probe comprising a conductive trace and a conductive contact element, wherein at least one of the beams has disposed thereon at least two of the probes;

an electrical interface to a tester; and electrical connections between the electrical interface and the first substrate.

16. The probe card assembly of claim 15 wherein each of a plurality of multiple ones of the beams has disposed thereon at least two of the probes, which are electrically insulated one from another.

17. The probe card assembly of claim 16 wherein two of the probes on at least one of the beams are configured as a differential pair of transmission paths.

18. The probe card assembly of claim 17, wherein multiple ones of the probes are electrically connected to multiple ones of the support members.

19. The probe card assembly of claim 15 further comprising structural members attached to multiple ones of the beams.

20. The probe card assembly of claim 19, wherein each structural member is configured to increase a spring constant of the beam to which the structural member is attached.

21. The probe card assembly of claim 20, wherein:

each structural member is electrically conductive, and the probe card assembly further comprises a plurality of second support members each disposed to connect electrically one of the structural members to a ground connection.

22. The probe card assembly of claim 15, wherein each beam is configured to twist about a first axis that is disposed between two of the conductive test probes attached to the beam and generally parallel to a length of the beam.

23. The probe card assembly of claim 22, wherein each beam is further configured to bend about a second axis that passes through the base and is generally perpendicular to the first axis as the free end of the beam rotates toward the surface of the substrate.

24. A method for testing a semiconductor device with a contactor device that comprises a substrate and a plurality of support members extending from a surface of the substrate, the contactor device further comprising a platform comprising a base attached to distal ends of the support members and a plurality of cantilevered beams, each of the beams being suspended above, spaced apart from, and substantially parallel to the surface of the substrate and extending from the base to a free end of the beam, the method comprising:

bringing probes of the contactor device into contact with terminals of the semiconductor device, the probes disposed on the beams, wherein at least two probes are disposed on at least one of the beams, the contact causing the free end of the at least one of the beams to rotate toward the surface of the substrate;

providing test signals through ones of the probes to ones of terminals of the semiconductor device; and sensing response signals generated by the semiconductor device in response to the test signals at others of the probes in contact with others of the terminals of the semiconductor device.

25. The method of 24, wherein:

the at least one of the beams twists about a first axis, providing compliance locally to each probe on the beam, and the at least one of the beams bends about a second axis different than the first axis, providing global compliance to the probes on the beam.

26. The method of claim 25, wherein the first axis is disposed between two of the probes disposed on the beam and generally parallel to a length of the beam.

27. The method of claim 26, wherein the second axis is through the base and substantially perpendicular to the first axis.

28. The resilient structure of claim 1, wherein the surface of the substrate comprises an electrically conductive terminal, and the first end of the support member is attached to the terminal.

29. The resilient structure of claim 1, wherein the support member is rigid.

30. The resilient structure of claim 15, wherein the support members are rigid.

* * * * *